(12) United States Patent
Lee et al.

(10) Patent No.: US 12,538,477 B2
(45) Date of Patent: Jan. 27, 2026

(54) SEMICONDUCTOR MEMORY DEVICE

(71) Applicant: SAMSUNG ELECTRONICS CO., LTD., Suwon-si (KR)

(72) Inventors: Kiseok Lee, Suwon-si (KR); Junhyeok Ahn, Suwon-si (KR); Keunnam Kim, Suwon-si (KR); Chan-Sic Yoon, Suwon-si (KR); Myeong-Dong Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 521 days.

(21) Appl. No.: 18/117,604

(22) Filed: Mar. 6, 2023

(65) Prior Publication Data
US 2023/0354588 A1  Nov. 2, 2023

(30) Foreign Application Priority Data
Apr. 29, 2022 (KR) .................. 10-2022-0053400

(51) Int. Cl.
H10B 12/00 (2023.01)

(52) U.S. Cl.
CPC ........... *H10B 12/485* (2023.02); *H10B 12/02* (2023.02); *H10B 12/315* (2023.02); *H10B 12/34* (2023.02); *H10B 12/482* (2023.02)

(58) Field of Classification Search
CPC ..... H10B 12/34; H10B 12/315; H10B 12/482
See application file for complete search history.

(56) References Cited

U.S. PATENT DOCUMENTS

| 8,247,324 B2 | 8/2012 | Shin et al. |
| 8,648,423 B2 | 2/2014 | Han et al. |
| 8,878,273 B2 | 11/2014 | Kim et al. |
| 8,916,447 B2 | 12/2014 | Park et al. |
| 9,276,074 B2 | 3/2016 | Choi et al. |
| 9,613,966 B2 | 4/2017 | Kim et al. |
| 9,761,593 B2 | 9/2017 | Shin |
| 10,211,091 B2 | 2/2019 | Lee et al. |
| 10,665,592 B2 * | 5/2020 | Song ............... H10B 12/485 |
| 10,796,950 B2 | 10/2020 | Lee et al. |
| 10,910,261 B2 | 2/2021 | Choi et al. |
| 2020/0013668 A1 * | 1/2020 | Choi ............... H10N 70/8833 |
| 2021/0273048 A1 * | 9/2021 | Park ............... H10B 12/482 |

FOREIGN PATENT DOCUMENTS

KR  10-2006-0108432 A  10/2006

* cited by examiner

*Primary Examiner* — Steven M Page
(74) *Attorney, Agent, or Firm* — Muir Patent Law, PLLC

(57) ABSTRACT

A semiconductor memory device includes a semiconductor substrate; a device isolation layer defining an active portion in the semiconductor substrate; a bit line structure intersecting the active portion on the semiconductor substrate; a first conductive pad between the bit line structure and the active portion; a bit line contact pattern between the first conductive pad and the bit line structure; a first bit line contact spacer covering a first sidewall of the first conductive pad; and a second bit line contact spacer covering a second sidewall of the first conductive pad, wherein the first conductive pad has a flat bottom surface that is in contact with a top surface of the active portion, and a width of the first bit line contact spacer is different from a width of the second bit line contact spacer.

20 Claims, 46 Drawing Sheets

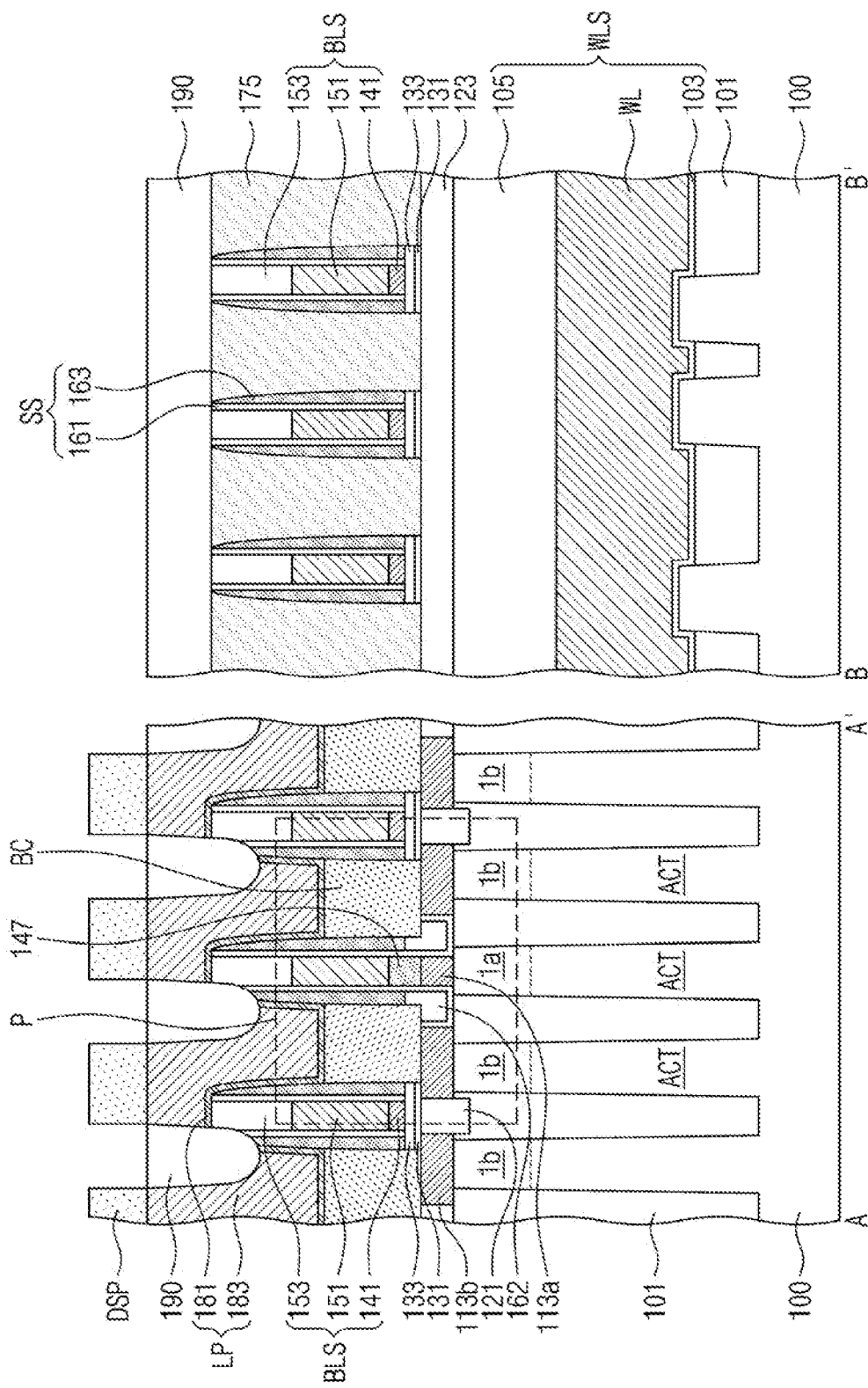

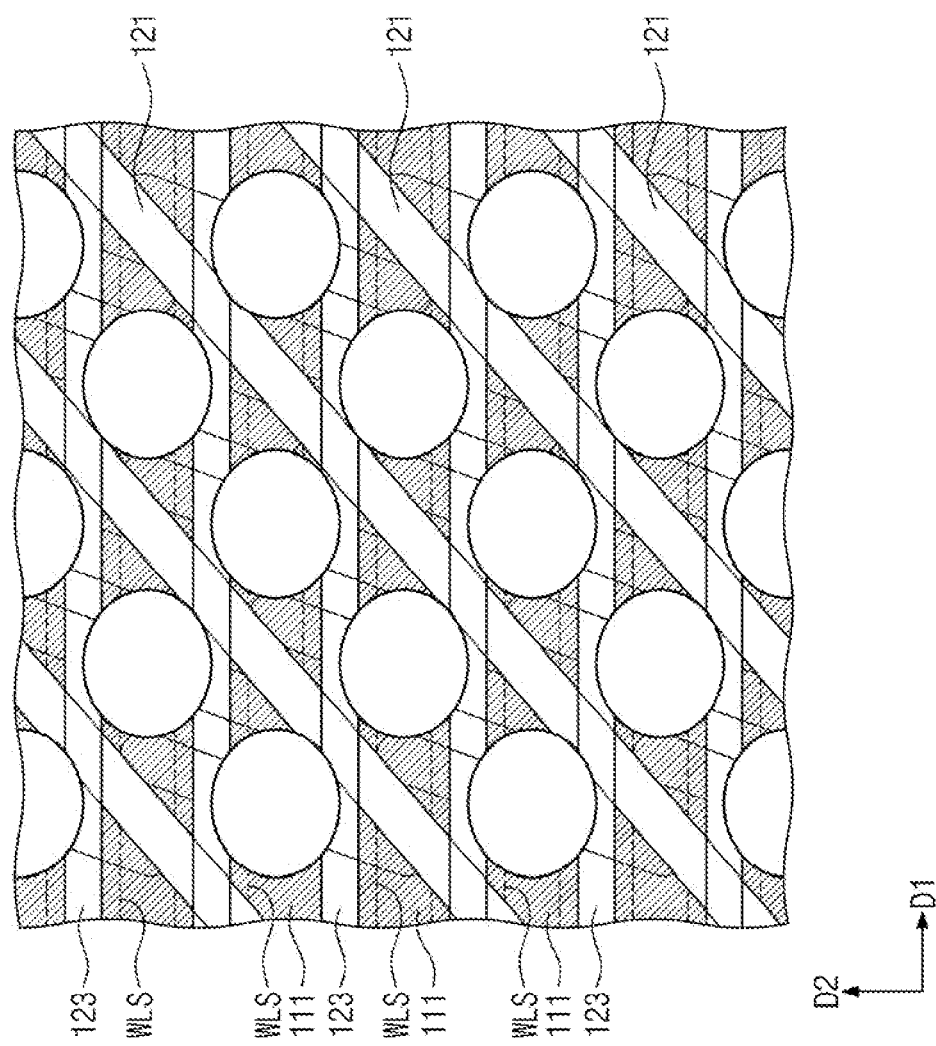

SEMICONDUCTOR MEMORY DEVICE

CROSS-REFERENCE TO RELATED APPLICATIONS

This U.S. non-provisional patent application claims priority under 35 U.S.C. § 119 to Korean Patent Application No. 10-2022-0053400, filed on Apr. 29, 2022, in the Korean Intellectual Property Office, the entire contents of which are hereby incorporated by reference.

BACKGROUND

1. Field

Embodiments relate to a semiconductor memory device.

2. Description of the Related Art

Semiconductor devices have been highly integrated to provide excellent performance and low manufacturing costs. The integration density of semiconductor devices may directly affect the costs of the semiconductor devices, thereby resulting in a demand of highly integrated semiconductor devices. The integration density of two-dimensional (2D) or planar semiconductor devices may be mainly determined by an area where a unit memory cell occupies, and thus the integration density of the 2D or planar semiconductor devices may be greatly affected by a technique of forming fine patterns. Extremely high-priced apparatuses may be used form fine patterns, the integration density of 2D semiconductor devices continues to increase but is still limited. Thus, semiconductor memory devices have been developed to improve their integration density, resistance, and current driving capability.

SUMMARY

The embodiments may be realized by providing a semiconductor memory device including a semiconductor substrate; a device isolation layer defining an active portion in the semiconductor substrate; a bit line structure intersecting the active portion on the semiconductor substrate; a first conductive pad between the bit line structure and the active portion; a bit line contact pattern between the first conductive pad and the bit line structure; a first bit line contact spacer covering a first sidewall of the first conductive pad; and a second bit line contact spacer covering a second sidewall of the first conductive pad, wherein the first conductive pad has a flat bottom surface that is in contact with a top surface of the active portion, and a width of the first bit line contact spacer is different from a width of the second bit line contact spacer.

The embodiments may be realized by providing a semiconductor memory device including a semiconductor substrate; a device isolation layer defining active portions in the semiconductor substrate; first pad insulating patterns on the semiconductor substrate and between the active portions, in a plan view; a first conductive pad on the semiconductor substrate and between the first pad insulating patterns adjacent to each other in a first direction; second conductive pads on the semiconductor substrate and between the first conductive pad and the first pad insulating patterns; a bit line structure on the first conductive pad, extending in a second direction, and intersecting the active portions; a bit line contact pattern between the bit line structure and the first conductive pad; and buried contact patterns on the second conductive pads, wherein the first conductive pad and the second conductive pad each have a flat bottom surface that are at substantially the same level, and the first conductive pad has a sidewall aligned with a sidewall of the bit line contact pattern.

The embodiments may be realized by providing a semiconductor memory device including a semiconductor substrate; a device isolation layer defining active portions in the semiconductor substrate; word line structures buried in the semiconductor substrate, extending in a first direction, and intersecting the active portions, each of the word line structures including a word line; a gate capping pattern on the word line; and a gate insulating pattern between the semiconductor substrate and the word line; first pad insulating patterns, each of which is on the semiconductor substrate and is between end portions of the active portions adjacent to each other in the first direction in a plan view; second pad insulating patterns extending in the first direction on the word line structures; a bit line structure intersecting the word line structures and extending in a second direction intersecting the first direction; a first conductive pad between the bit line structure and the active portion; a bit line contact pattern between the bit line structure and the first conductive pad; second conductive pads on the semiconductor substrate and on end portions of the active portions; bit line spacers on sidewalls of the bit line structure; and buried contact patterns on the second conductive pads, wherein the first conductive pad and the second conductive pad each have a flat bottom surface, the bottom surface of the first conductive pad and the bottom surface of the second conductive pad are each at substantially the same level as a top surface of the gate capping pattern, and the first conductive pad has a sidewall aligned with a sidewall of the bit line contact pattern and at least one of the sidewalls of the bit line structure.

The embodiments may be realized by providing a method of manufacturing a semiconductor memory device, the method including forming a device isolation layer defining active portions in a semiconductor substrate; forming word line structures in the semiconductor substrate such that the word line structures extend in a first direction and intersect the active portions; forming a pad conductive layer covering a top surface of the semiconductor substrate; forming first pad insulating patterns penetrating the pad conductive layer such that each of the first pad insulating patterns is between end portions of the active portions adjacent to each other in the first direction, when viewed in a plan view; forming second pad insulating patterns that penetrate the pad conductive layer and extend in the first direction on the word line structures; forming a buffer insulating layer on the pad conductive layer; forming openings penetrating the buffer insulating layer to expose a top surface of the pad conductive layer such that the openings correspond to central portions of the active portions; forming a contact conductive layer filling the openings; forming a bit line structure on the buffer insulating layer and the contact conductive layer such that the bit line structure extend in a second direction intersecting the first direction; and forming bit line spacers on sidewalls of the bit line structure, wherein forming the bit line structure includes patterning the contact conductive layer and the pad conductive layer to form a first conductive pad on the central portions of the active portions and a contact pattern between the first conductive pad and the bit line structure.

BRIEF DESCRIPTION OF THE DRAWINGS

Features will be apparent to those of skill in the art by describing in detail exemplary embodiments with reference to the attached drawings in which:

FIG. 2A is a cross-sectional view taken along lines A-A' and B-B' of FIG. 1.

FIGS. 5A to 14A are plan views of stages in a method of manufacturing a semiconductor memory device according to some embodiments.

FIGS. 5B to 14B are cross-sectional views taken along lines A-A' and B-B' of FIGS. 5A to 14A, respectively.

FIGS. 5C to 14C are cross-sectional views taken along lines C-C' and D-D' of FIGS. 5A to 14A, respectively.

FIGS. 6D to 11D are plan views of stages in a method of manufacturing a semiconductor memory device according to some embodiments.

DETAILED DESCRIPTION

Figure 1:
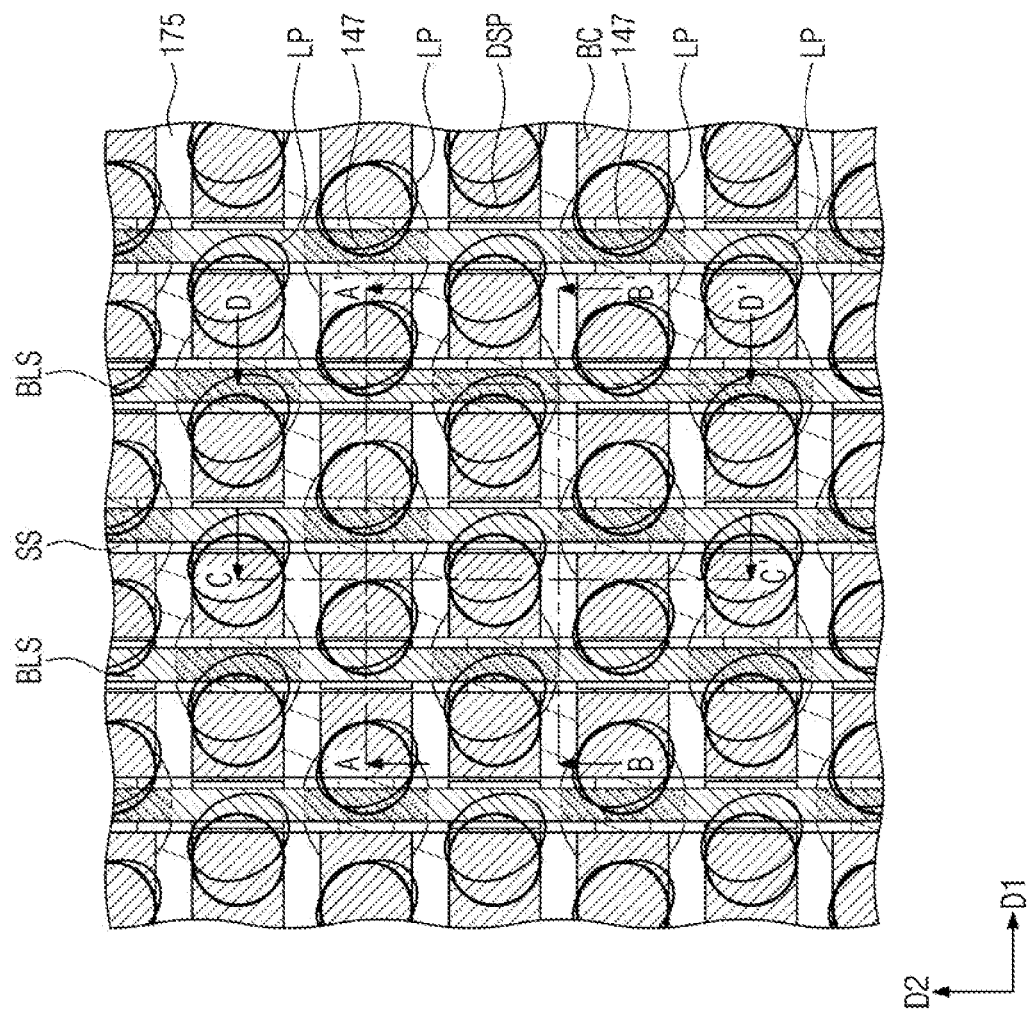
FIG. 1 is a plan view illustrating a semiconductor memory device according to some embodiments.
Figure 2B:
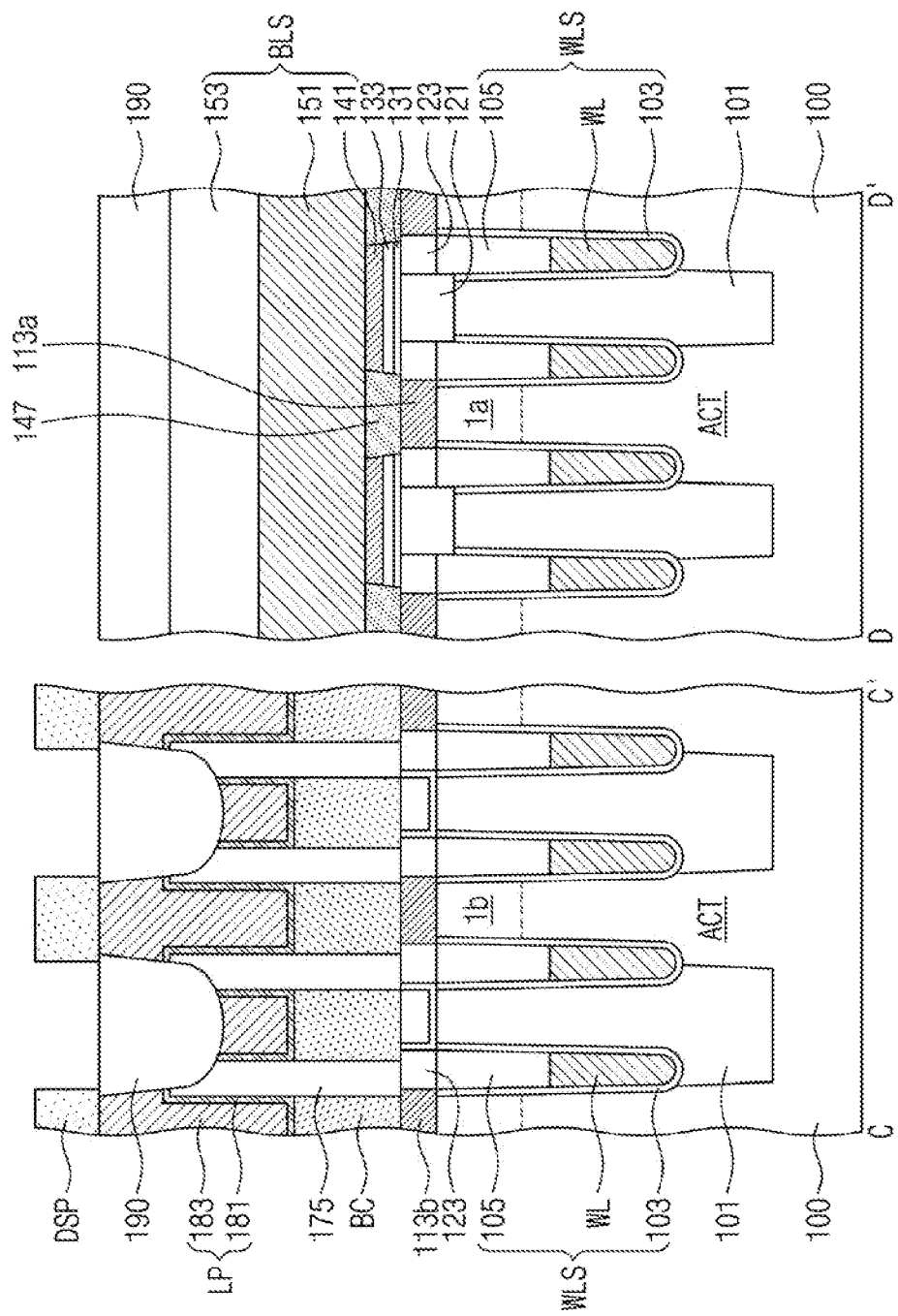
FIG. 2B is a cross-sectional view taken along lines C-C' and D-D' of FIG. 1.

FIG. 1 is a plan view illustrating a semiconductor memory device according to some embodiments. FIG. 2A is a cross-sectional view taken along lines A-A' and B-B' of FIG. 1. FIG. 2B is a cross-sectional view taken along lines C-C' and D-D' of FIG. 1. FIGS. 3A to 3E are enlarged views of a portion 'P' of FIG. 2A. FIGS. 4A and 4B are plan views illustrating portions of semiconductor memory devices according to some embodiments.

Referring to FIGS. 1, 2A and 2B, a device isolation layer 101 defining active portions ACT may be in a semiconductor substrate 100. The semiconductor substrate 100 may be, e.g., a silicon substrate, a germanium substrate, or a silicon-germanium substrate. The device isolation layer 101 may include, e.g., silicon oxide, silicon nitride, or silicon oxynitride. A top surface of the device isolation layer 101 may be coplanar with a top surface of the semiconductor substrate 100. As used herein, the term "or" is not an exclusive term, e.g., "A or B" would include A, B, or A and B.

In an implementation, the active portions ACT may have rectangular shapes (or bar shapes) in a plan view and may be two-dimensionally arranged in a first direction D1 and a second direction D2 intersecting the first direction D1 (e.g., perpendicular to the first direction D1). The active portions ACT may be arranged in a zigzag form when viewed in a plan view, and each of the active portions ACT may have a longitudinal axis (or long axis) in an oblique direction with respect to the first direction D1 and the second direction D2.

Word line structures WLS may intersect the active portions ACT in the semiconductor substrate 100 and may extend in the first direction D1. Each of the word line structures WLS may include a word line WL, a gate insulating pattern 103 between the semiconductor substrate 100 and the word line WL, and a gate capping pattern 105 on the word line WL.

The word lines WL may be in the semiconductor substrate 100 and may extend in the first direction D1 to intersect the active portions ACT and the device isolation layer 101 when viewed in a plan view. Each of the active portions ACT may intersect a pair of the word lines WL. Top surfaces of the word lines WL may be lower than the top surface of the semiconductor substrate 100. A height of a bottom surface of the word line WL may be varied depending on a material thereunder. In an implementation, a height of a portion, on the active portion ACT, of the bottom surface of the word line WL may be higher than a height of a portion, on the device isolation layer 101, of the bottom surface of the word line WL. A top surface of the gate capping pattern 105 may be substantially coplanar with the top surface of the semiconductor substrate 100 and the top surface of the device isolation layer 101.

The word lines WL may include a conductive material. The gate insulating pattern 103 may include, e.g., silicon oxide, silicon nitride, silicon oxynitride, or a high-k dielectric material. In an implementation, the gate capping pattern 105 may include, e.g., a silicon nitride layer or a silicon oxynitride layer.

First and second dopant regions 1a and 1b may be in each of the active portions ACT at both sides of each of the word lines WL. Bottom surfaces of the first and second dopant regions 1a and 1b may be at a predetermined depth from a top surface of the active portion ACT. The first dopant region 1a may be in a central portion of each of the active portions ACT between the word lines WL, and the second dopant regions 1b may be spaced apart from the first dopant region 1a and may be in end portions of each of the active portions ACT, respectively. The first and second dopant regions 1a and 1b may be doped with dopants having a conductivity type opposite to that of the semiconductor substrate 100.

First conductive pads 113a and second conductive pads 113b may be on the top surface of the semiconductor substrate 100.

Each of the first conductive pads 113a may be connected to the first dopant region 1a of each of the active portions ACT. The second conductive pads 113b may be connected to the second dopant regions 1b of each of the active portions ACT, respectively. The first and second conductive pads 113a and 113b may include a semiconductor material doped with dopants or a metal (e.g., titanium, tungsten, or tantalum).

The second conductive pads 113b may be laterally (or horizontally) spaced apart from the first conductive pads 113a.

Figure 3A:
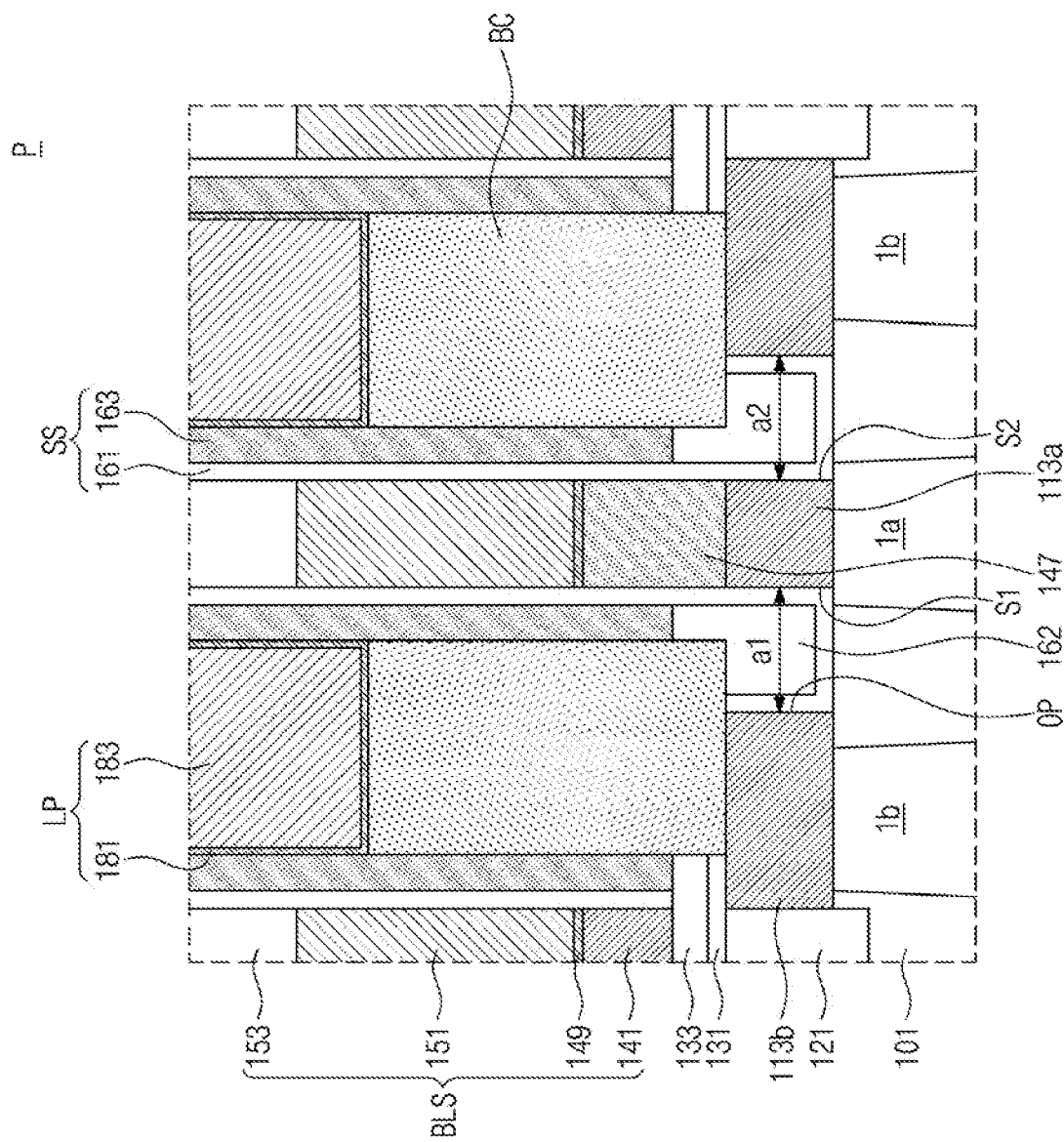
FIGS. 3A to 3E are enlarged views of a portion 'P' of FIG. 2A.
Figure 3B:
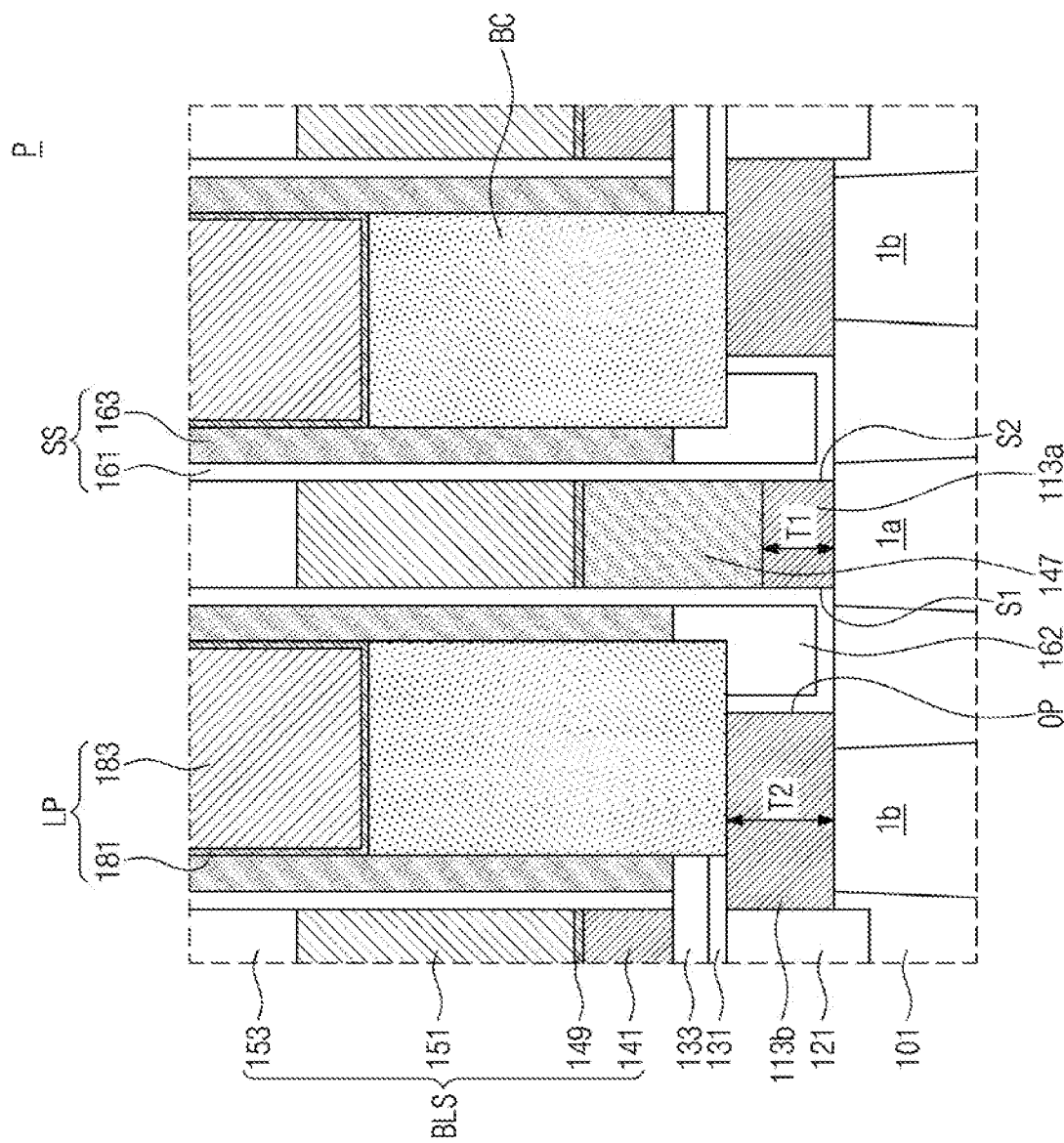
Figure 4A:
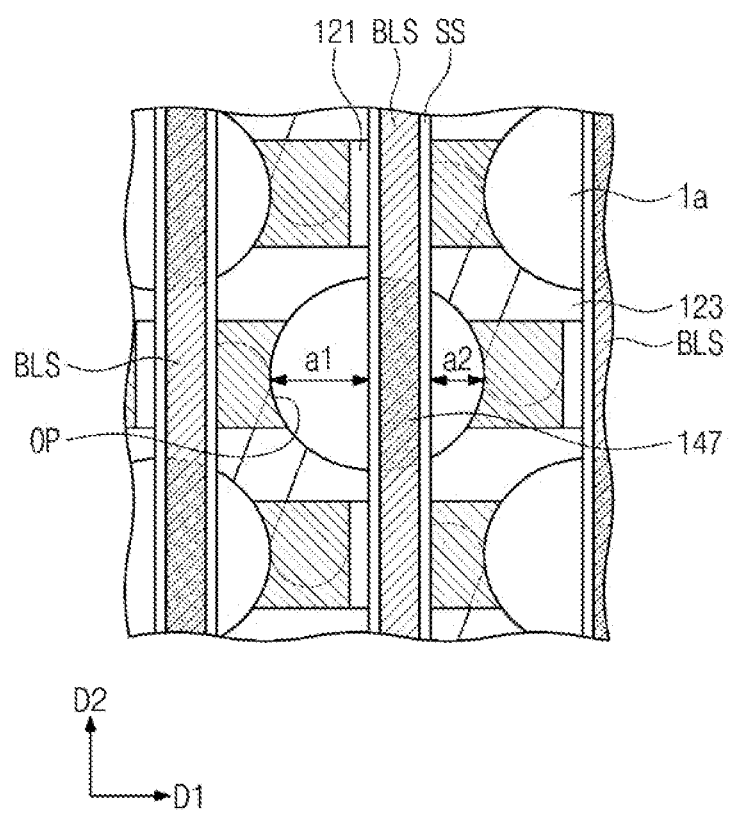
FIGS. 4A and 4B are plan views illustrating portions of semiconductor memory devices according to some embodiments.
Figure 4B:
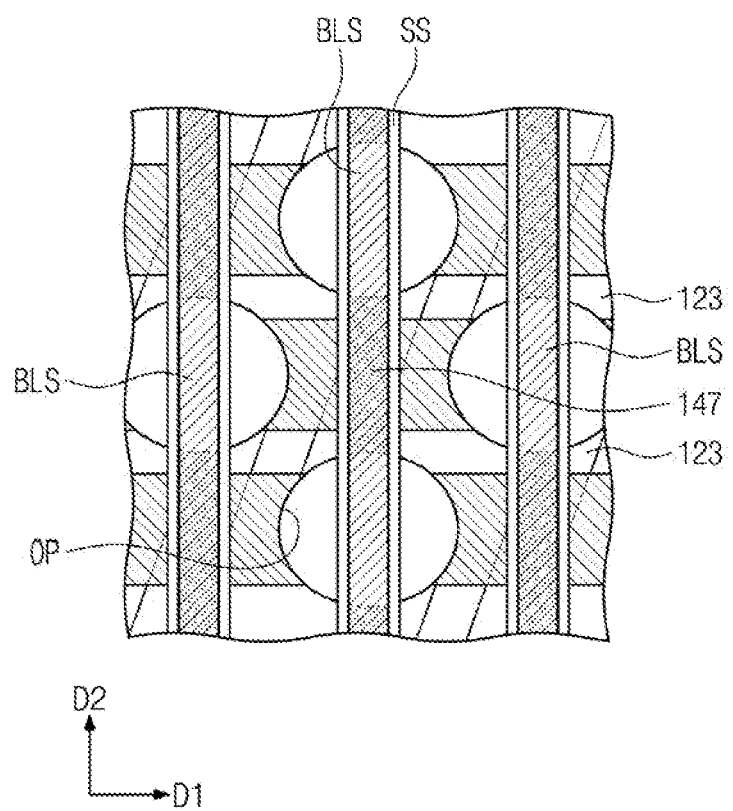

In an implementation, referring to FIG. 3A, the first conductive pad 113a may have a first sidewall S1 and a second sidewall S2, which are opposite to each other. In an implementation, a distance a1 between the first sidewall S1 of the first conductive pad 113a and the second conductive pad 113b adjacent thereto may be substantially equal to a distance a2 between the second sidewall S2 of the first conductive pad 113a and the second conductive pad 113b adjacent thereto.

Figure 3C:
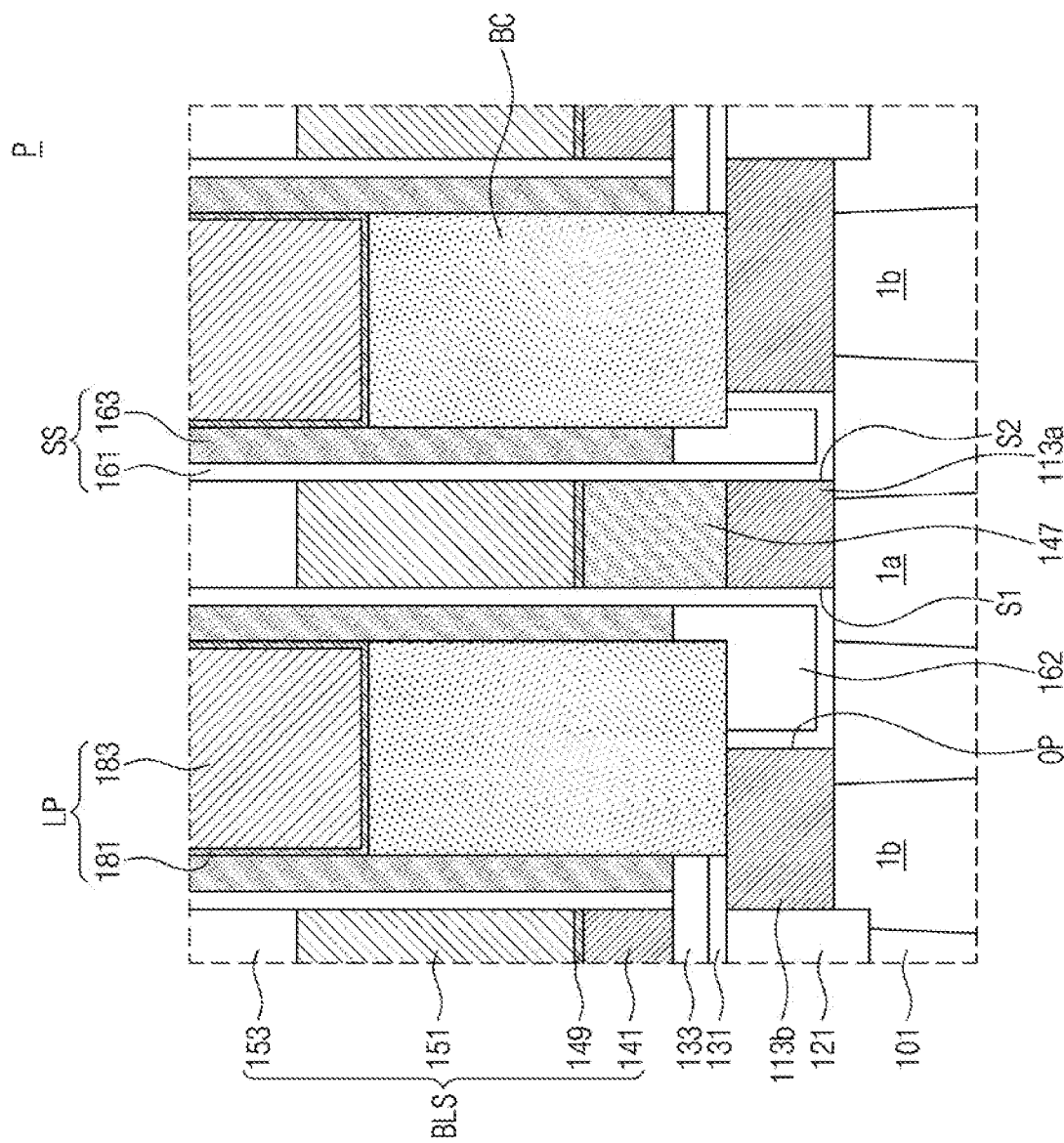

In an implementation, referring to FIGS. 3C and 4A, the distance a1 between the first sidewall S1 of the first conductive pad 113a and the second conductive pad 113b adjacent thereto may be different from the distance a2 between the second sidewall S2 of the first conductive pad 113a and the second conductive pad 113b adjacent thereto. In an implementation, the distance a1 between the first sidewall S1 of the first conductive pad 113a and the second conductive pad 113b may be greater than the distance a2 between the second sidewall S2 of the first conductive pad 113a and the second conductive pad 113b.

Each of the first and second conductive pads 113a and 113b may have a flat bottom surface and may be in direct contact with the top surface of the semiconductor substrate 100. In an implementation, the bottom surfaces of the first and second conductive pads 113a and 113b may be at substantially the same level as the top surface of the semiconductor substrate 100.

In an implementation, top surfaces of the first and second conductive pads 113a and 113b may be at substantially the same level, as illustrated in FIG. 3A. In an implementation, referring to FIG. 3B, the top surface of the first conductive pad 113a may be at a lower level than the top surfaces of the second conductive pads 113b. In an implementation, a thickness T1 (in a vertical direction) of the first conductive pad 113a may be less than a thickness T2 of the second conductive pad 113b.

Bit line spacers SS and bit line contact spacers 162 may be at both sides of the first conductive pad 113a. In an implementation, portions of the bit line spacers SS and the bit line contact spacers 162 may be between the first conductive pad 113a and the second conductive pads 113b.

Each of first pad insulating patterns 121 may be between end portions of two active portions ACT adjacent to each other on the semiconductor substrate 100. In an implementation, each of the first pad insulating patterns 121 may be between the second dopant regions 1b adjacent to each other in the first direction D1. Bottom surfaces of the first pad insulating patterns 121 may be at a lower level than the top surface of the semiconductor substrate 100 or the top surface of the device isolation layer 101. The first pad insulating patterns 121 may be arranged in a zigzag form or a honeycomb form when viewed in a plan view. Each of the first pad insulating patterns 121 may have a rectangular shape or a parallelogram shape when viewed in a plan view.

Second pad insulating patterns 123 may extend in the first direction D1 on the word line structures WLS. Bottom surfaces of the second pad insulating patterns 123 may be at substantially the same level as the bottom surfaces of the first and second conductive pads 113a and 113b.

The first conductive pad 113a may be between the first pad insulating patterns 121 adjacent to each other in the first direction D1 and between the second pad insulating patterns 123 adjacent to each other in the second direction D2. In an implementation, the first and second pad insulating patterns 121 and 123 may include, e.g., a silicon nitride layer or a silicon oxynitride layer.

A first buffer insulating layer 131 and a second buffer insulating layer 133 on the first buffer insulating layer 131 may be on the first and second pad insulating patterns 121 and 123. In an implementation, the first buffer insulating layer 131 may be a silicon oxide layer, and the second buffer insulating layer 133 may be a silicon nitride layer. In an implementation, only one of the first buffer insulating layer 131 and the second buffer insulating layer 133 may be provided. Each of the first and second buffer insulating layers 131 and 133 may have an island shape when viewed in a plan view. In an implementation, the first and second buffer insulating layers 131 and 133 may cover end portions of two active portions ACT adjacent to each other and a portion of the device isolation layer 101 therebetween.

In an implementation, bit line structures BLS may extend in the second direction D2 on the semiconductor substrate 100 and may intersect the word lines WL.

Each of the bit line structures BLS may include a poly-silicon pattern 141, a metal pattern 151 and a hard mask pattern 153, which are sequentially stacked. The first and second buffer insulating layers 131 and 133 may be between the poly-silicon pattern 141 and the first and second pad insulating patterns 121 and 123. In an implementation, the poly-silicon patterns 141 may be omitted on the first conductive pads 113a. The metal pattern 151 may include a conductive metal nitride (e.g., titanium nitride or tantalum nitride) or a (e.g., non-compounded) metal (e.g., tungsten, titanium, or tantalum). The hard mask pattern 153 may include an insulating material such as silicon nitride or silicon oxynitride.

Referring to FIG. 3A, each of the bit line structures BLS may further include a silicide pattern 149 between the poly-silicon pattern 141 and the metal pattern 151. The silicide pattern 149 may include, e.g., titanium silicide, cobalt silicide, or nickel silicide.

A bit line contact pattern 147 may be between each of the first conductive pads 113a and the metal pattern 151 of a corresponding bit line structure BLS. The bit line contact pattern 147 may include poly-silicon doped with dopants. A top surface of the bit line contact pattern 147 may be at substantially the same level as a top surface of the poly-silicon pattern 141 of the bit line structure BLS.

In an implementation, referring to FIG. 4A, the bit line contact pattern 147 may be in an opening OP defined in the first and second buffer insulating layers 131 and 133. In an implementation, referring to FIG. 4B, the bit line contact pattern 147 may be between openings OP defined in the first and second buffer insulating layers 131 and 133.

In an implementation, the bit line contact pattern 147 may have sidewalls aligned with sidewalls of the metal pattern 151 and sidewalls of the first conductive pad 113a. In an implementation, the bit line contact pattern 147 may have a width in the first direction D1, which is substantially equal to a width of the bit line structure BLS in the first direction D1 and a width of the first conductive pad 113a in the first direction D1. A length of the bit line contact pattern 147 in the second direction D2 may be greater than a length of the first conductive pad 113a in the second direction D2.

The bit line contact spacers 162 may be on both sidewalls of the first conductive pad 113a. The bit line contact spacers 162 may be formed of an insulating material. In an implementation, each of the bit line contact spacers 162 may include a silicon oxide layer, a silicon nitride layer, or a silicon oxynitride layer. In an implementation, each of the bit line contact spacers 162 may be formed of a multi-layer in certain embodiments.

Referring to FIGS. 3A and 3C, the bit line contact spacers 162 may have substantially flat bottom surfaces. The bottom surfaces of the bit line contact spacers 162 may be at substantially the same level at both sides of the first conductive pad 113a.

Referring to FIG. 3C, a width of the bit line contact spacer 162 on the first sidewall S1 of the first conductive pad 113a may be different from a width of the bit line contact spacer 162 on the second sidewall S2 of the first conductive pad 113a.

Figure 3D:
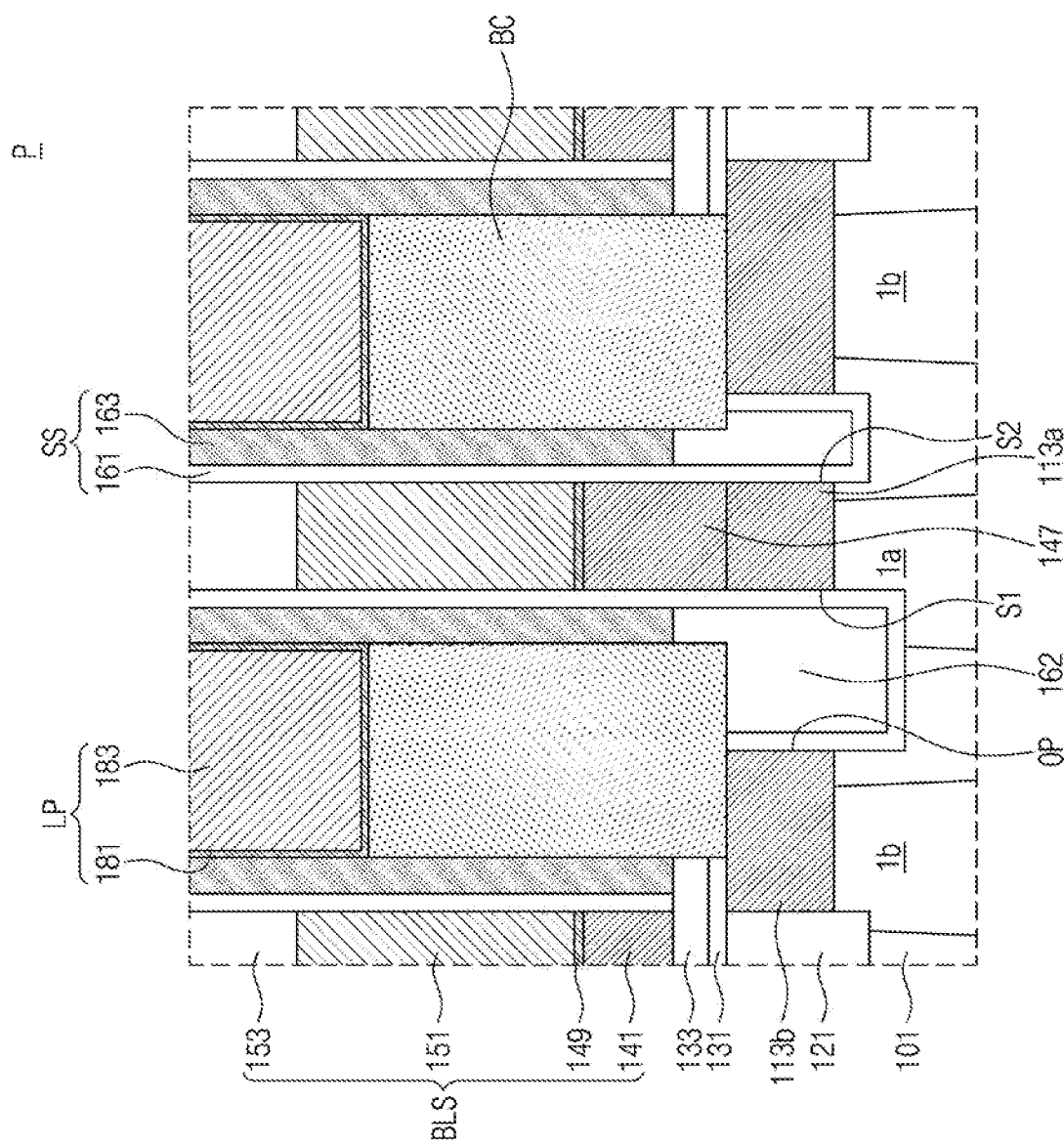
Figure 3E:
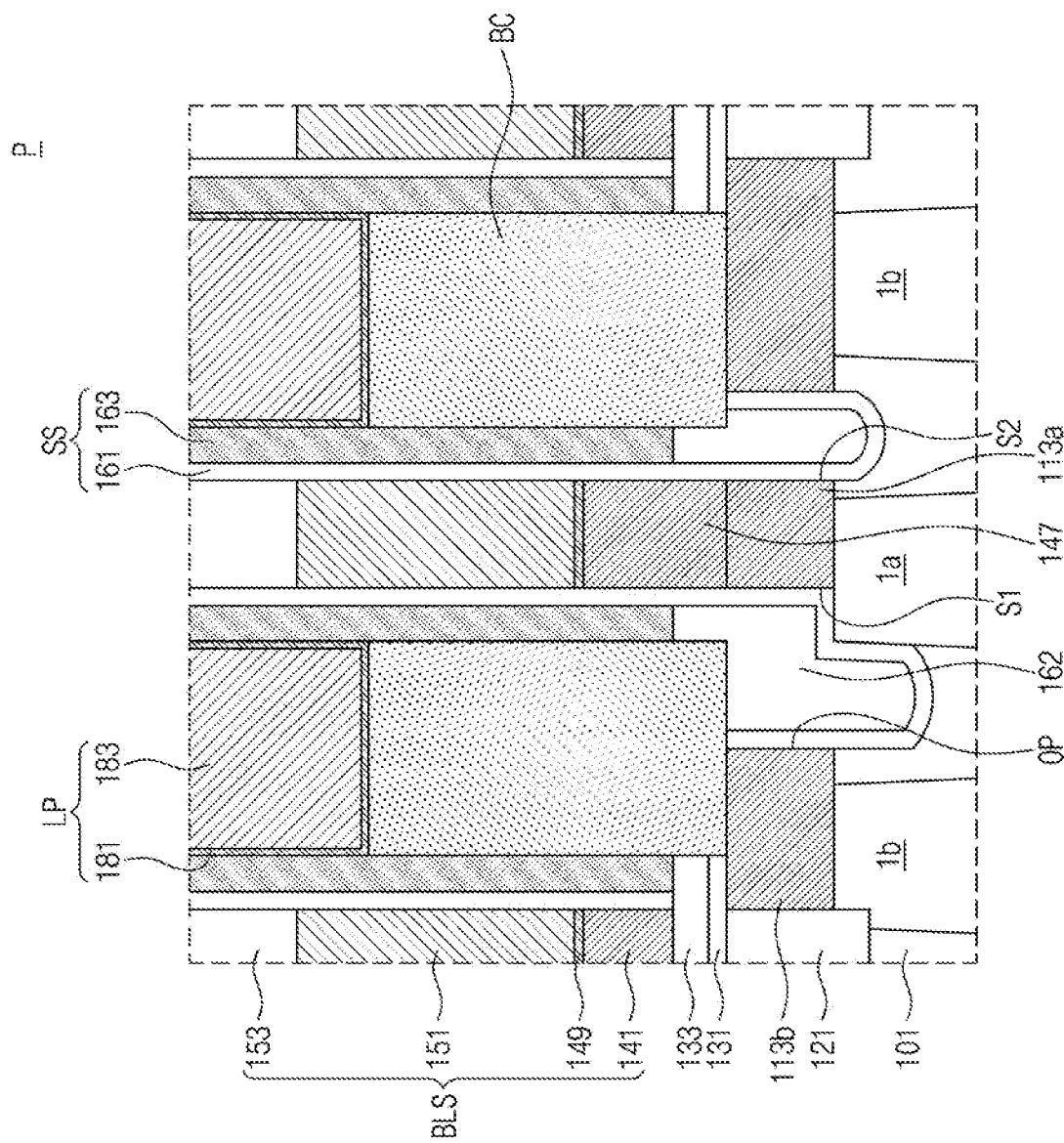

In an implementation, according to the embodiments of FIGS. 3D and 3E, the bottom surfaces of the bit line contact spacers 162 may be at a lower level than the bottom surface of the first conductive pad 113a. Referring to FIG. 3D, the bottom surface of the bit line contact spacer 162 at a side of the first sidewall S1 of the first conductive pad 113a may be at a lower level than the bottom surface of the bit line contact spacer 162 at a side of the second sidewall S2 of the first conductive pad 113a. Referring to FIG. 3E, the bit line contact spacers 162 may have rounded bottom surfaces. At least one of the bit line contact spacers 162 may have a first thickness (e.g., in the vertical direction) on the active portion ACT (i.e., the first dopant region 1a) and a second thickness on the device isolation layer 101, which are different from each other.

In an implementation, the bit line spacers SS may be on both sidewalls of the bit line structure BLS. The bit line spacers SS may extend in the second direction D2 along the sidewalls of the bit line structure BLS. The bit line spacers SS may be between buried contact patterns BC and the sidewalls of the bit line structure BLS and between fence patterns 175 and the sidewalls of the bit line structure BLS.

Each of the bit line spacers SS may include a silicon oxide layer, a silicon nitride layer, or a silicon oxynitride layer. In an implementation, the bit line spacers SS may be formed as a multi-layer. In an implementation, each of the bit line spacers SS may include first and second spacers 161 and 163 sequentially formed on the sidewall of the bit line structure BLS. The first and second spacers 161 and 163 may include insulating materials having etch selectivity with respect to each other. In an implementation, the first spacer 161 may include silicon oxide, and the second spacer 163 may include silicon nitride. In an implementation, the first spacer 161 may cover the sidewall of the bit line contact pattern 147 and the sidewall of the first conductive pad 113a. In an implementation, the bit line spacer SS may include an air gap between insulating layers.

The buried contact patterns BC may be on the second conductive pads 113b, respectively. The buried contact patterns BC may be between the bit line structures BLS adjacent to each other. The buried contact patterns BC may include, e.g., poly-silicon doped with dopants or a metal material. The buried contact patterns BC may be electrically connected to the second dopant regions 1b, respectively. Each of the buried contact patterns BC may be between the word lines WL and between the bit line structures BLS when viewed in a plan view.

The buried contact patterns BC may be spaced apart from each other and may be two-dimensionally arranged, when viewed in a plan view. In an implementation, the buried contact patterns BC arranged in the first direction D1 may be spaced apart from each other with the bit line structures BLS therebetween. The buried contact patterns BC arranged in the second direction D2 may be spaced apart from each other with the fence patterns 175 therebetween. Each of the buried contact patterns BC may fill a space defined by the bit line structures BLS adjacent to each other in the first direction D1 and the fence patterns 175 adjacent to each other in the second direction D2. Top surfaces of the buried contact patterns BC may be at a lower level than top surfaces of the fence patterns 175 and top surfaces of the bit line structures BLS. The top surfaces of the buried contact patterns BC may be at a lower level than a top surface of the metal pattern 151 of the bit line structure BLS.

Bottom surfaces of the buried contact patterns BC may be in direct contact with the top surfaces of the second conductive pads 113b, respectively. In an implementation, the buried contact patterns BC may be electrically insulated from the first conductive pads 113a and the bit line contact patterns 147 by the bit line contact spacers 162. The fence patterns 175 may be spaced apart from each other in the second direction D2 between the bit line structures BLS. Each of the fence patterns 175 may be between the buried contact patterns BC adjacent to each other in the second direction D2. The fence patterns 175 may overlap with the word line structures WLS when viewed in a plan view, and the fence patterns 175 may be on the second pad insulating patterns 123. The top surfaces of the fence patterns 175 may be at substantially the same level as the top surfaces of the bit line structures BLS. The fence patterns 175 may include an insulating material, e.g., silicon nitride.

Landing pads LP may be on the buried contact patterns BC, respectively. The landing pads LP may be electrically connected to the buried contact patterns BC, respectively.

Each of the landing pads LP may include a lower portion filling the space between the bit line structures BLS and between the fence patterns 175, and an upper portion extending from the lower portion onto a portion of the bit line structure BLS. In an implementation, the upper portion of the landing pad LP may overlap with the portion of the bit line structure BLS when viewed in a plan view. Each of the upper portions of the landing pads LP may cover a top surface of the hard mask pattern 153 of the bit line structure BLS and may have a width greater than that of the buried contact pattern BC (e.g., when measured in a same direction). In an implementation, the width of the upper portion of the landing pad LP may be greater than a distance between the bit line structures BLS or a width of the bit line structure BLS. The upper portion of the landing pad LP may extend onto the bit line structure BLS as described above, and an area of a top surface of the landing pad LP may be increased.

The top surface of the landing pad LP may be at a higher level than the top surfaces of the bit line structures BLS, and a bottom surface of the landing pad LP may be at a lower level than the top surfaces of the bit line structures BLS. In an implementation, the bottom surface of the landing pad LP may be at a lower level than the top surface of the metal pattern 151 of the bit line structure BLS.

The upper portion of the landing pad LP may have an elliptical shape having a longitudinal axis (or long axis) and a short axis when viewed in a plan view, and the upper portion of the landing pad LP may have the longitudinal axis in an oblique direction with respect to the first direction D1 and the second direction D2. In an implementation, the upper portion of the landing pad LP may have, e.g., a rounded diamond shape, a rounded trapezoid shape, or a rounded tetragonal shape.

Each of the landing pads LP may include a barrier metal pattern 181 and a metal pattern 183. The barrier metal pattern 181 may include a conductive metal nitride (e.g., titanium nitride, tantalum nitride, or tungsten nitride). The metal pattern 183 may include a metal (e.g., tungsten, titanium, or tantalum).

In an implementation, a metal silicide layer (e.g., titanium silicide, cobalt silicide, nickel silicide, tungsten silicide, platinum silicide, or molybdenum silicide) may be between the barrier metal pattern 181 and the buried contact pattern BC.

A recess insulating pattern 190 may fill a space between the upper portions of the landing pads LP. The recess insulating pattern 190 may have a rounded bottom surface, and the bottom surface of the recess insulating pattern 190 may be in contact with portions of the bit line spacers SS. A top surface of the recess insulating pattern 190 may be coplanar with the top surfaces of the landing pads LP.

The recess insulating pattern 190 may be in direct contact with the landing pads LP and the hard mask patterns 153 of the bit line structures BLS. The recess insulating pattern 190 may include a silicon oxide layer, a silicon nitride layer, or a silicon oxynitride layer. The recess insulating pattern 190 may be formed as a single layer or multi-layer.

Data storage patterns DSP may be on the landing pads LP, respectively. The data storage patterns DSP may be electrically connected to the second dopant regions 1b through the landing pads LP and the buried contact patterns BC, respectively. Each of the data storage patterns DSP may be laterally offset from the lower portion of a corresponding one of the landing pads LP and may be in contact with a portion of the corresponding landing pad LP. In an implementation, the data storage patterns DSP may be arranged in a honeycomb form or a zigzag form when viewed in a plan view.

In an implementation, each of the data storage patterns DSP may be a capacitor and may include lower and upper electrodes and a dielectric layer therebetween. In an implementation, each of the data storage patterns DSP may be a variable resistance pattern switchable between two resistance states by an electrical pulse applied thereto. In an implementation, the data storage patterns DSP may include a phase-change material of which a crystal state is changeable depending on the amount of a current, a perovskite compound, a transition metal oxide, a magnetic material, a ferromagnetic material, or an antiferromagnetic material.

FIGS. 5A to 14A are plan views of stages in a method of manufacturing a semiconductor memory device according to some embodiments. FIGS. 5B to 14B are cross-sectional views taken along lines A-A' and B-B' of FIGS. 5A to 14A, respectively. FIGS. 5C to 14C are cross-sectional views taken along lines C-C' and D-D' of FIGS. 5A to 14A, respectively. FIGS. 6D to 11D are plan views of stages in a method of manufacturing a semiconductor memory device according to some embodiments.

Figure 5A:
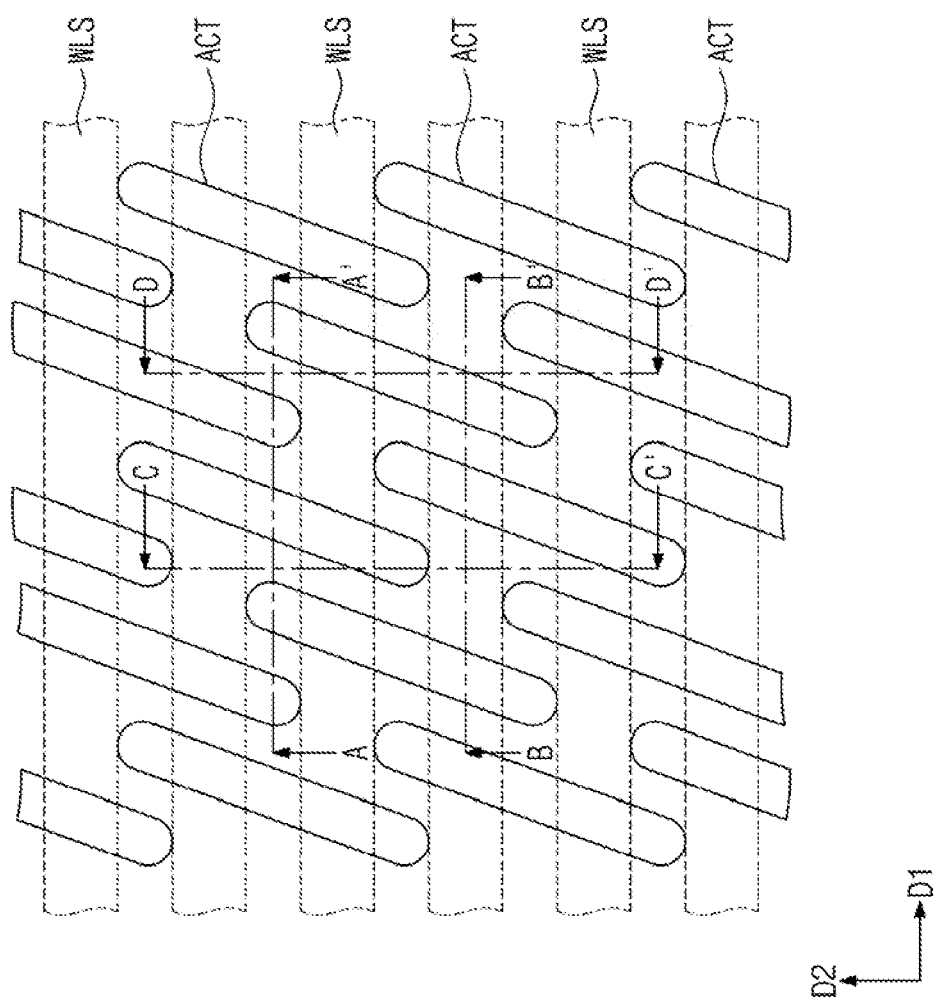
Figure 5B:
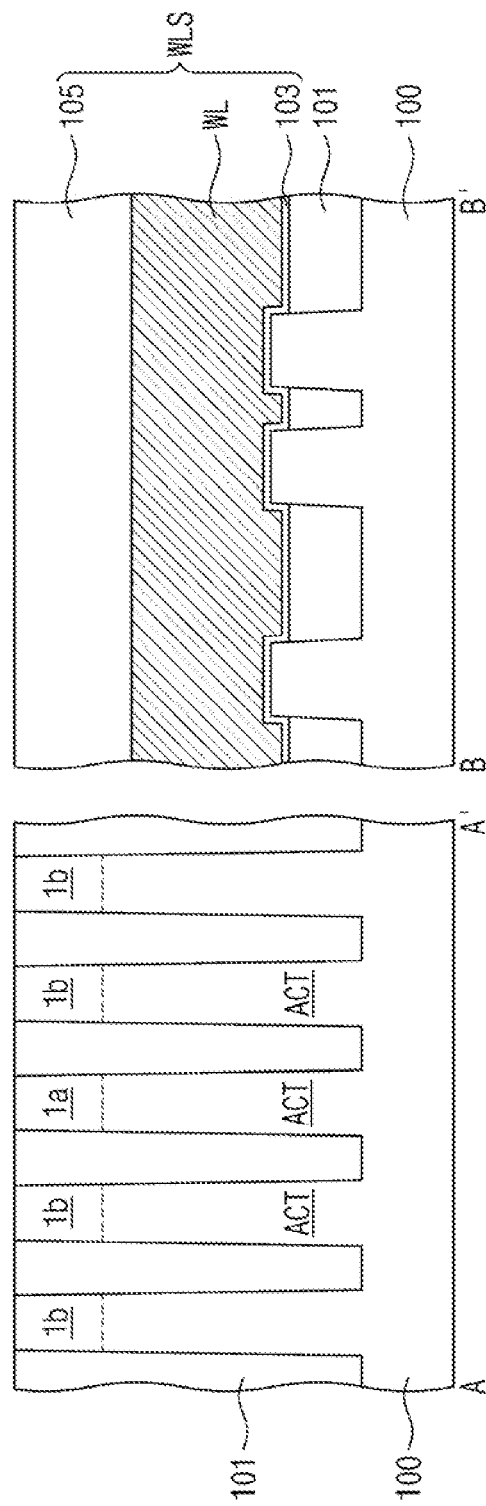
Figure 5C:
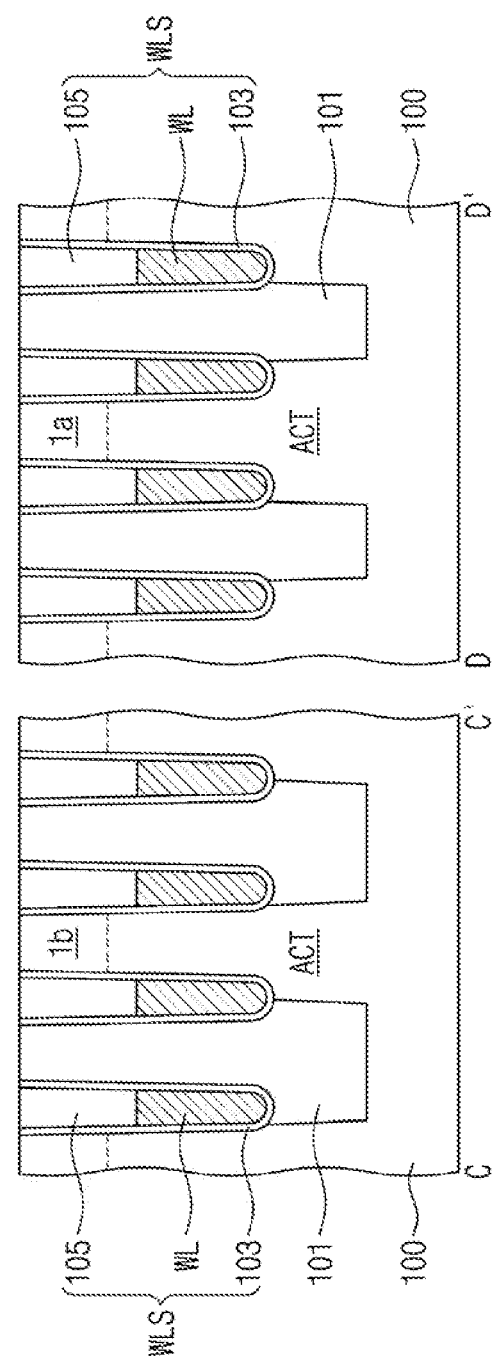

Referring to FIGS. 5A, 5B and 5C, a device isolation layer 101 defining active portions ACT may be formed in a semiconductor substrate 100.

The formation of the device isolation layer 101 may include forming an etch mask on the semiconductor substrate 100, etching the semiconductor substrate 100 using the etch mask to form a trench, forming an insulating layer filling the trench, and planarizing the insulating layer to expose a top surface of the semiconductor substrate 100. The device isolation layer 101 may include an insulating material. In an implementation, the device isolation layer 101 may include silicon oxide, silicon nitride, or silicon oxynitride. The semiconductor substrate 100 may include silicon or germanium.

In an implementation, the active portions ACT may have rectangular shapes (or bar shapes) and may be two-dimensionally arranged in the first direction D1 and the second direction D2. The active portions ACT may be arranged in a zigzag form when viewed in a plan view, and each of the active portions ACT may have a longitudinal axis (or long axis) in an oblique direction with respect to the first direction D1 and the second direction D2.

A plurality of word line structures WLS extending in the first direction D1 may be formed in the semiconductor substrate 100.

In an implementation, the active portions ACT and the device isolation layer 101 may be patterned to form gate recess regions 102 extending in the first direction D1, and word lines WL may be formed in the gate recess regions 102 with a gate insulating layer between the word lines WL and inner surfaces of the gate recess regions 102. Bottom surfaces of the gate recess regions 102 may be above a bottom surface of the device isolation layer 101. Top surfaces of the word lines WL may be below a top surface of the device isolation layer 101.

In an implementation, the gate insulating layer may include a high-k dielectric layer, a silicon oxide layer, a silicon nitride layer, or a silicon oxynitride layer. In an implementation, the high-k dielectric layer may include, e.g., hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

Gate capping patterns 105 may be formed in the gate recess regions 102 in which the word lines WL are formed. Top surfaces of the gate capping patterns 105 may be at substantially the same level as the top surface of the semiconductor substrate 100 and the top surface of the device isolation layer 101. The gate capping patterns 105 may be formed of an insulating material different from that of the device isolation layer 101. In an implementation, the gate capping patterns 105 may include a silicon nitride layer or a silicon oxynitride layer.

After the formation of the word line structures WLS, first and second dopant regions 1a and 1b may be formed in the active portions ACT at both sides of each of the word line structures WLS. The first and second dopant regions 1a and 1b may be formed by performing an ion implantation process and may have a conductivity type opposite to that of the active portion ACT. The first dopant region 1a may be in a central portion of each of the active portions ACT, and the second dopant regions 1b may be in end portions of each of the active portions ACT, respectively.

Figure 6A:
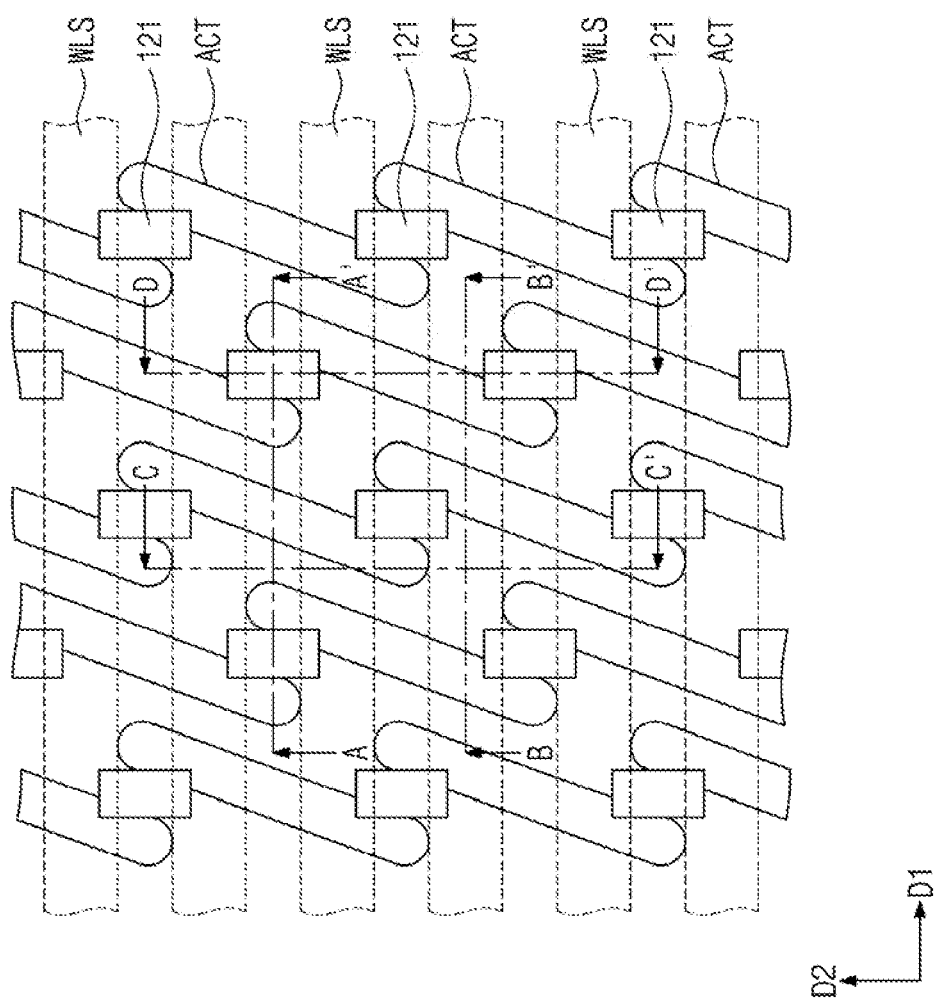
Figure 6B:
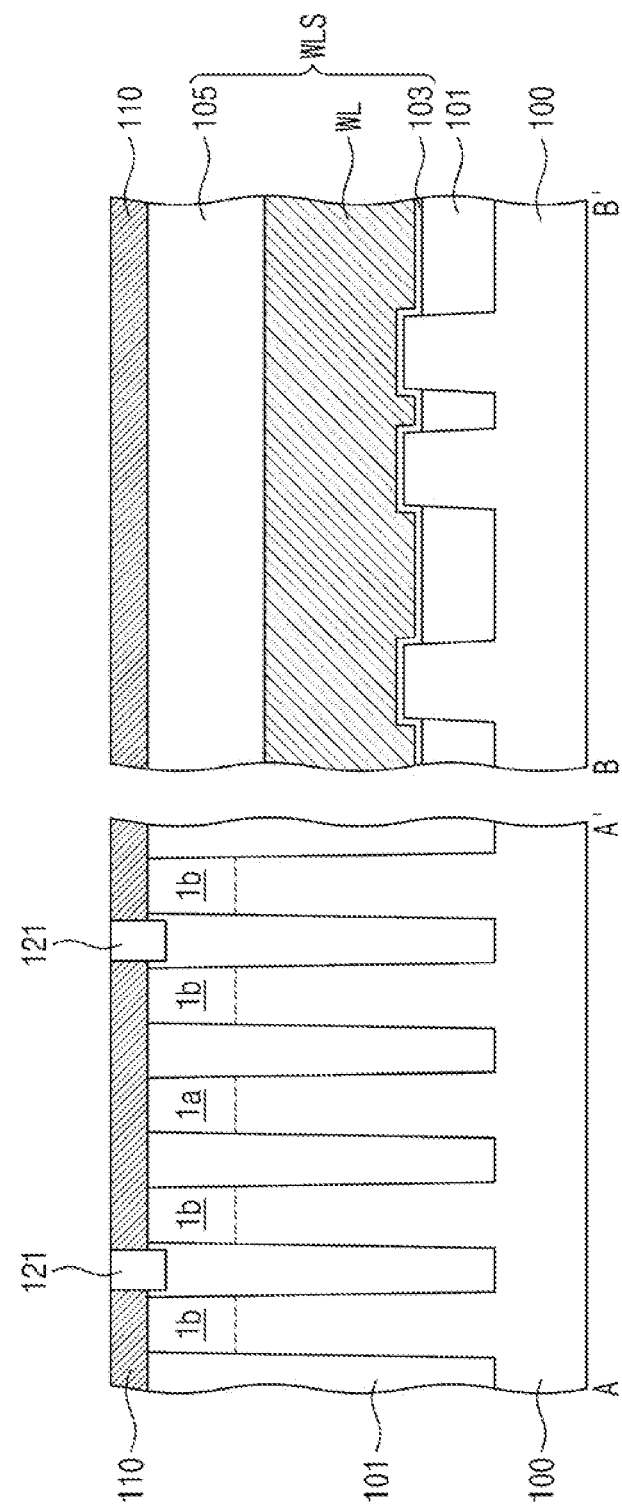
Figure 6C:
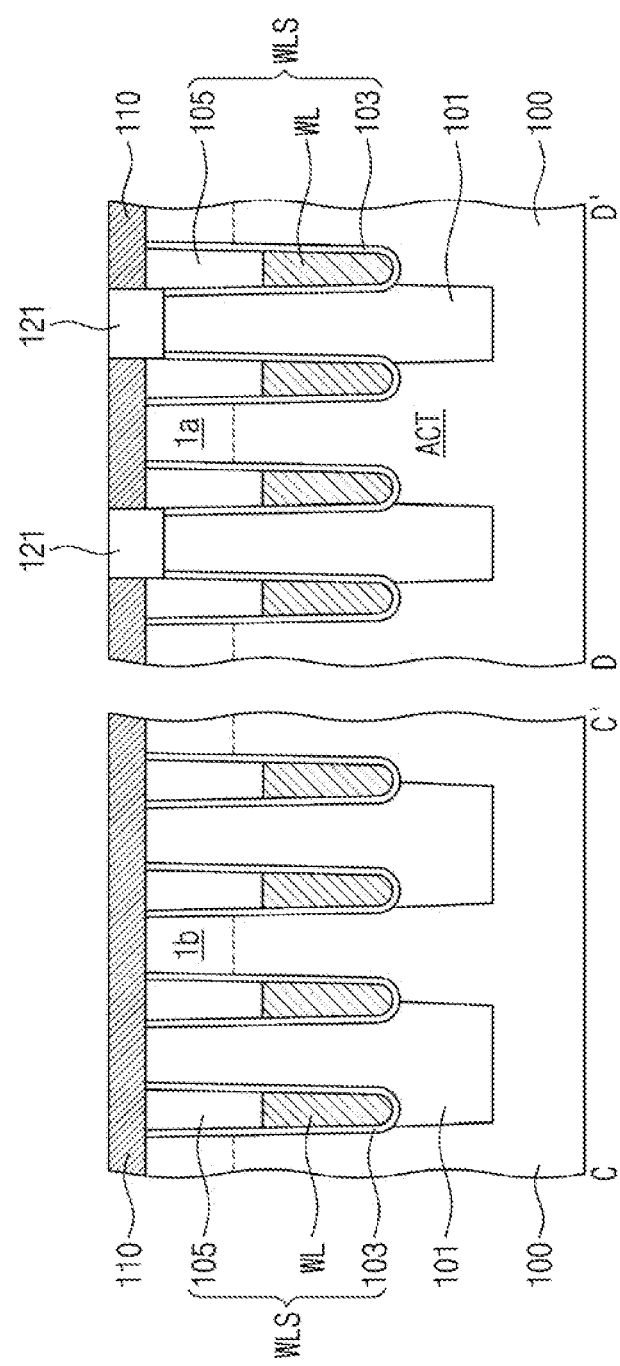

Referring to FIGS. 6A, 6B and 6C, a pad conductive layer 110 may be formed on an entire top surface of the semiconductor substrate 100. The pad conductive layer 110 may be deposited directly on the top surface of the semiconductor substrate 100, the top surface of the device isolation layer 101, and top surfaces of the word line structures WLS. The pad conductive layer 110 may be formed of a semiconductor layer doped with dopants (e.g., a doped poly-silicon layer).

Next, first pad insulating patterns 121 may be formed to penetrate the pad conductive layer 110. The formation of the first pad insulating patterns 121 may include forming a mask pattern on the pad conductive layer 110, anisotropically etching the pad conductive layer 110 using the mask pattern as an etch mask to form holes exposing the top surface of the device isolation layer 101, forming an insulating layer filling the holes, and planarizing the insulating layer to expose a top surface of the pad conductive layer 110. Here, portions of the top surface of the device isolation layer 101 exposed by the holes may be recessed in the anisotropic etching process of the pad conductive layer 110. Thus, bottom surfaces of the first pad insulating patterns 121 may be at a lower level than the top surface of the semiconductor substrate 100 and the top surface of the device isolation layer 101. Top surfaces of the first pad insulating patterns 121 may be substantially coplanar with the top surface of the pad conductive layer 110 by the planarization process. In an implementation, the first pad insulating patterns 121 may include a silicon nitride layer or a silicon oxynitride layer.

The first pad insulating patterns 121 may be arranged in a zigzag form or a honeycomb form when viewed in a plan view. Each of the first pad insulating patterns 121 may be between the second dopant regions 1b adjacent to each other in the first direction D1. In an implementation, each of the first pad insulating patterns 121 may be between the word line structures WLS adjacent to each other.

Figure 6D:
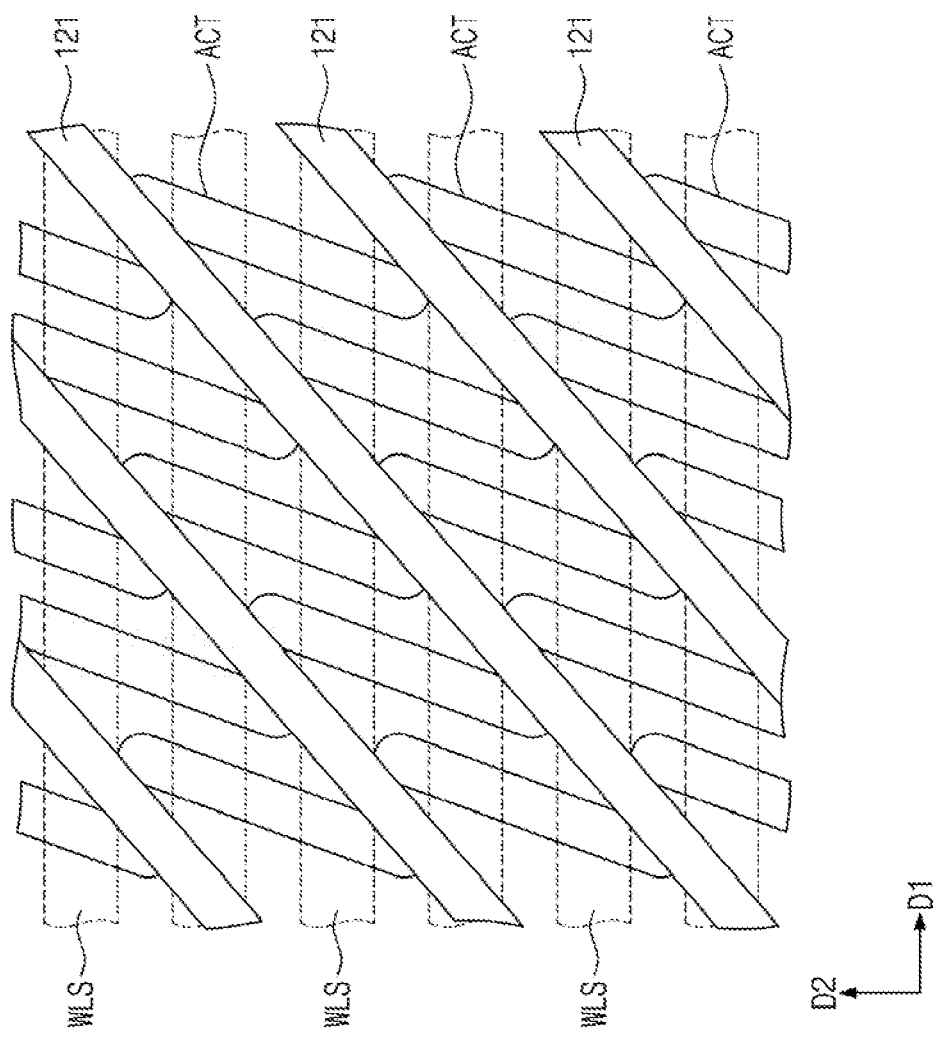

In an implementation, referring to FIG. 6D, the first pad insulating patterns 121 may have line shapes extending in an oblique or inclined direction with respect to the first direction D1 and the second direction D2. Each of the first pad insulating patterns 121 may pass between the second dopant regions 1b adjacent to each other.

Figure 7A:
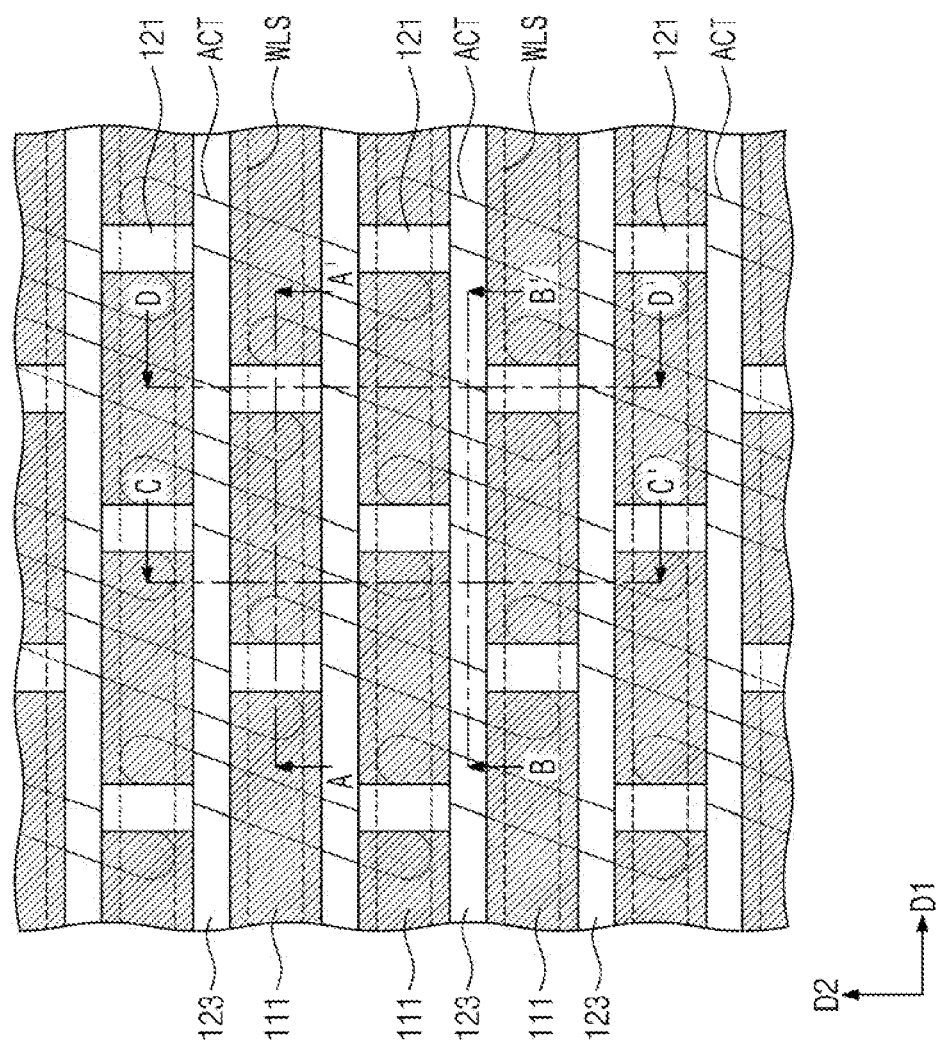
Figure 7B:
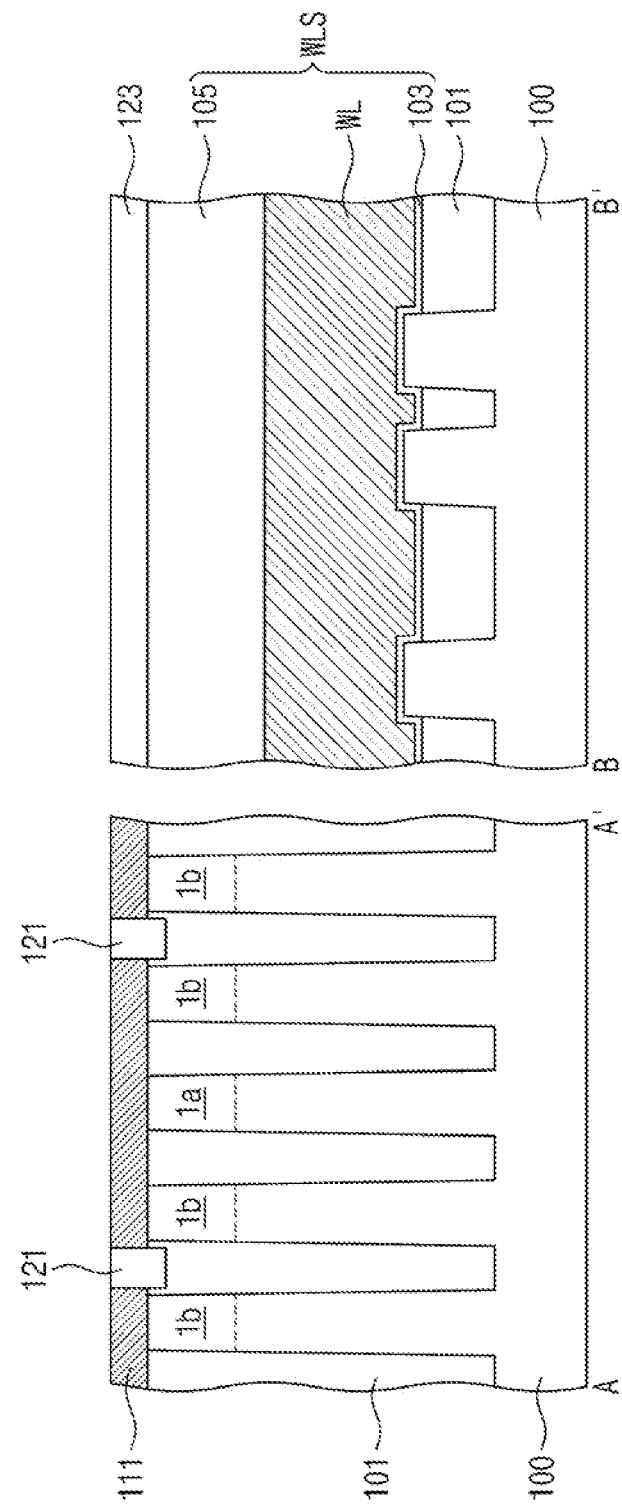
Figure 7C:
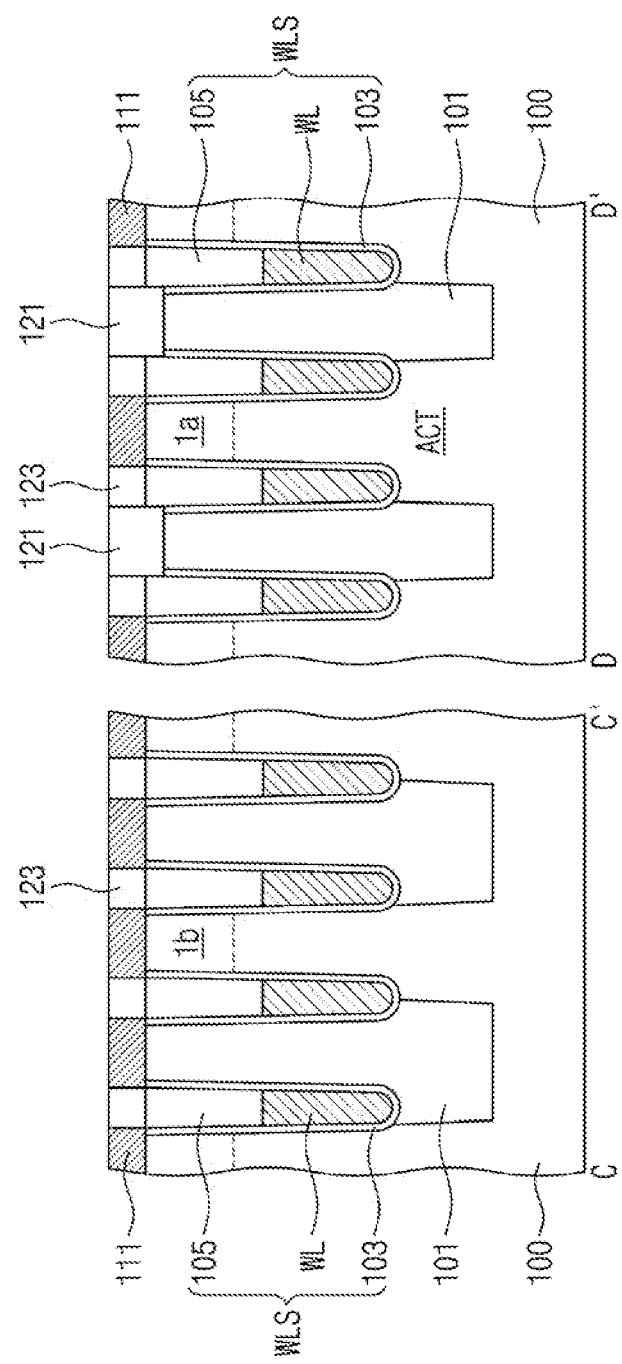
Figure 7D:
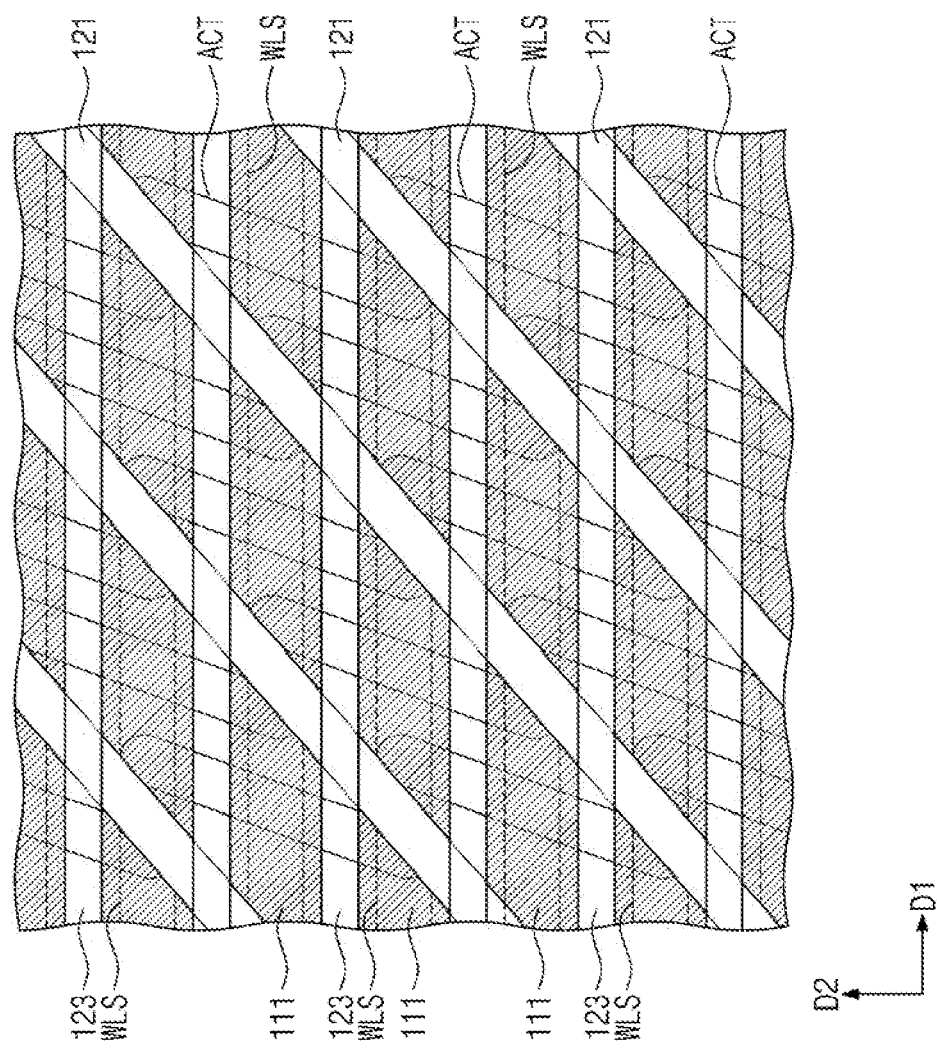
Figure 8A:
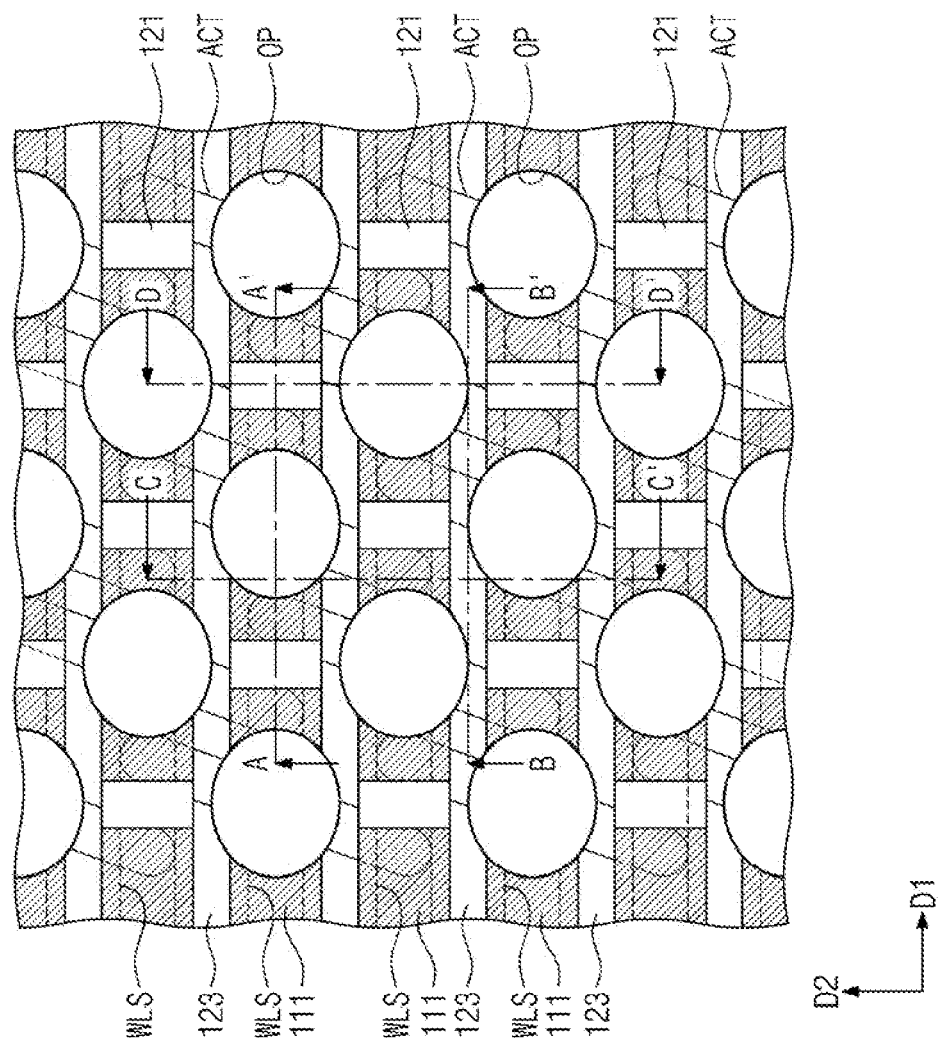
Figure 8B:
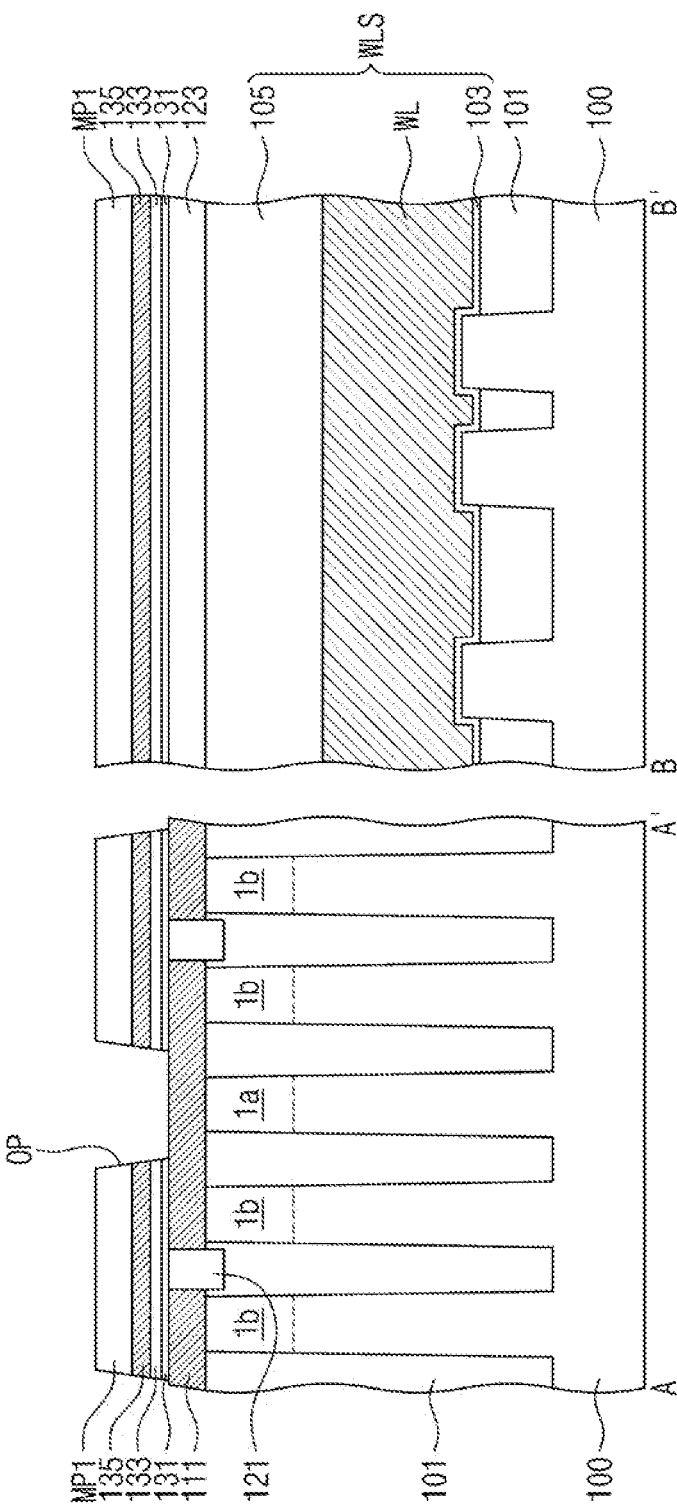
Figure 8C:
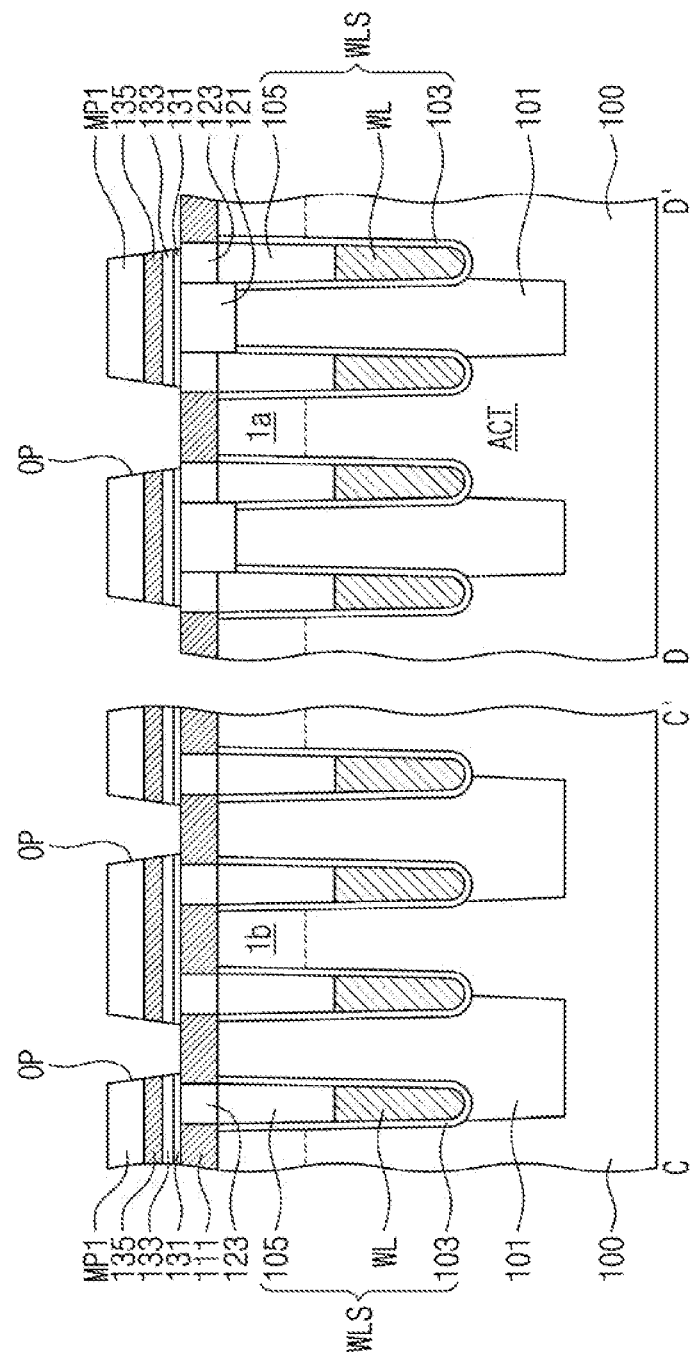
Figure 9A:
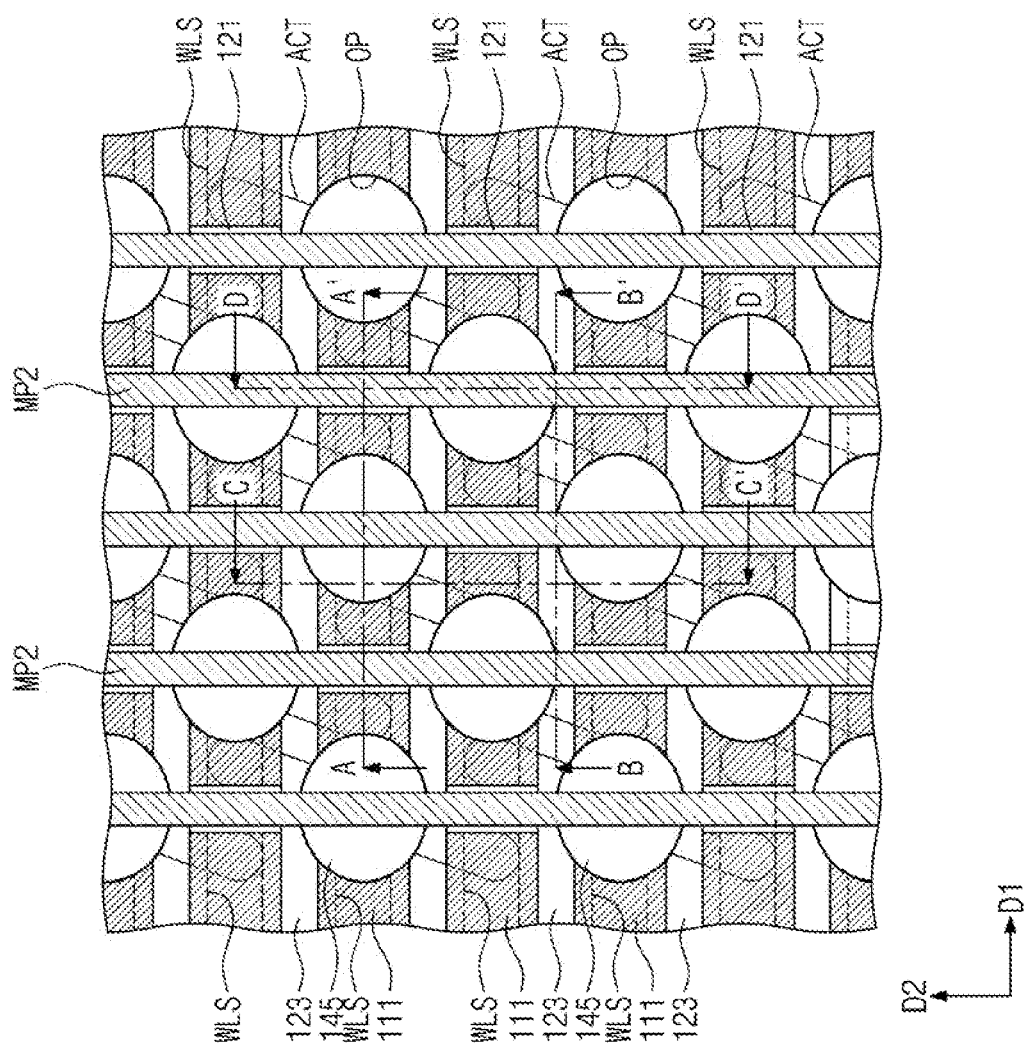
Figure 9B:
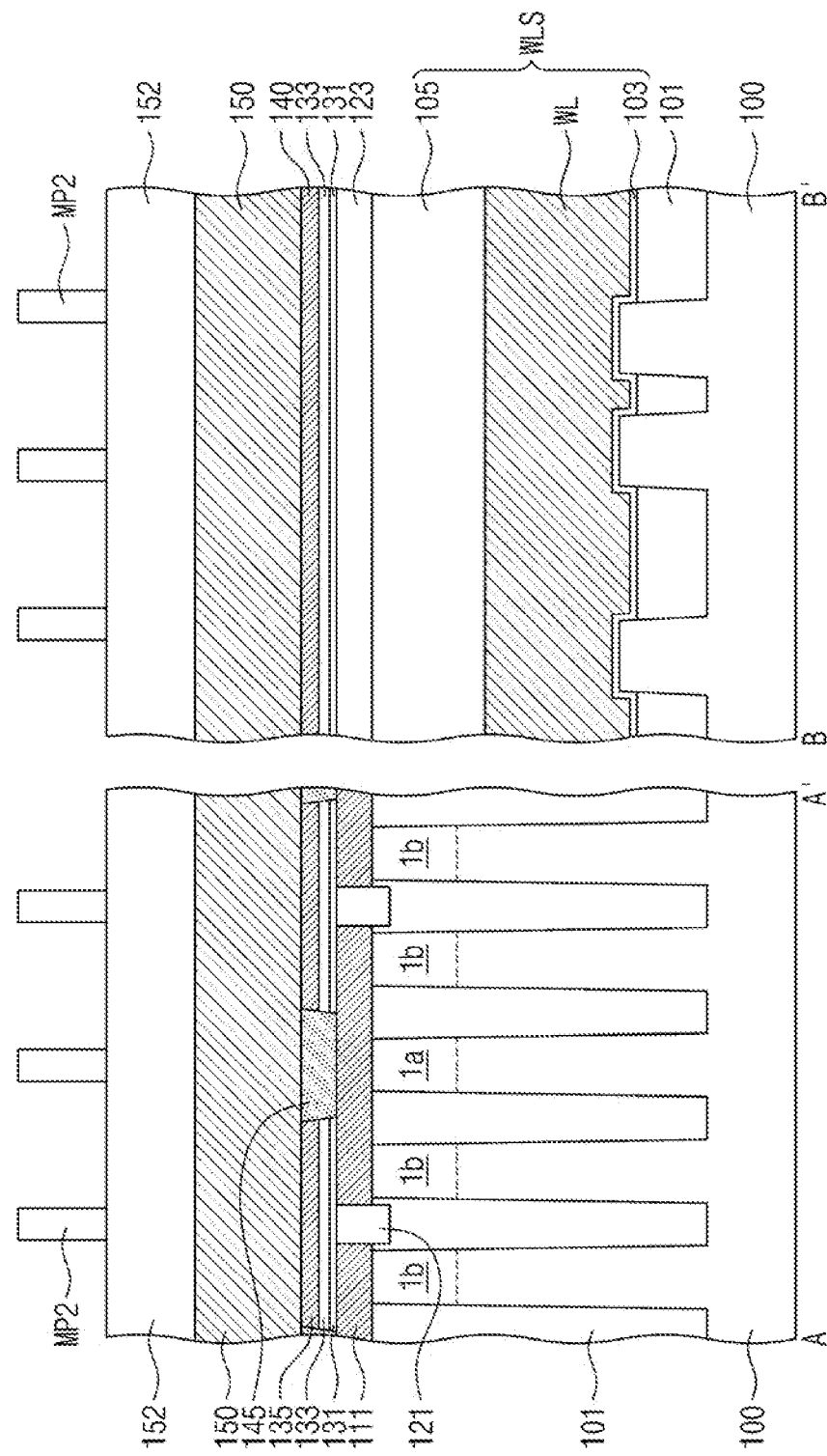
Figure 9C:
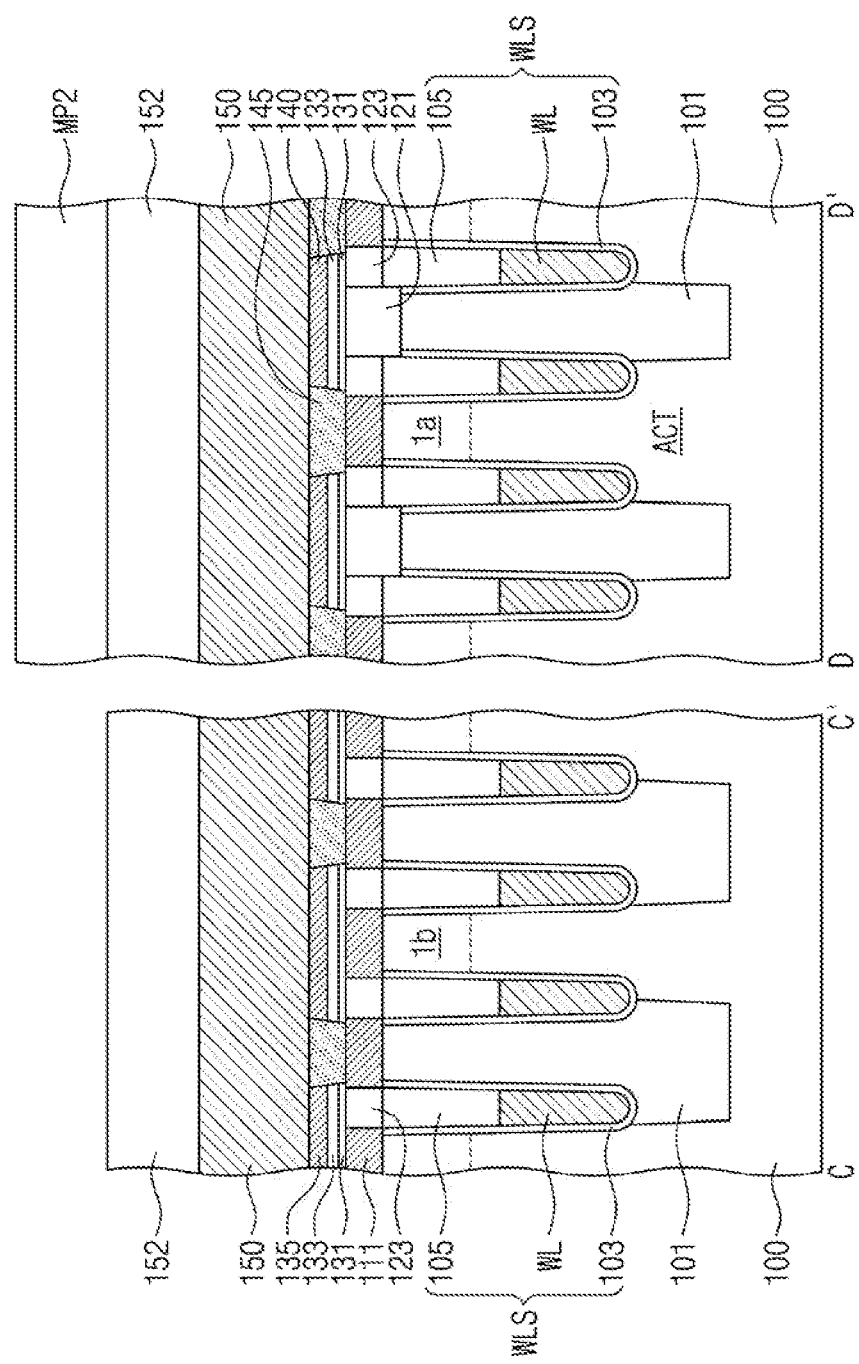
Figure 9D:
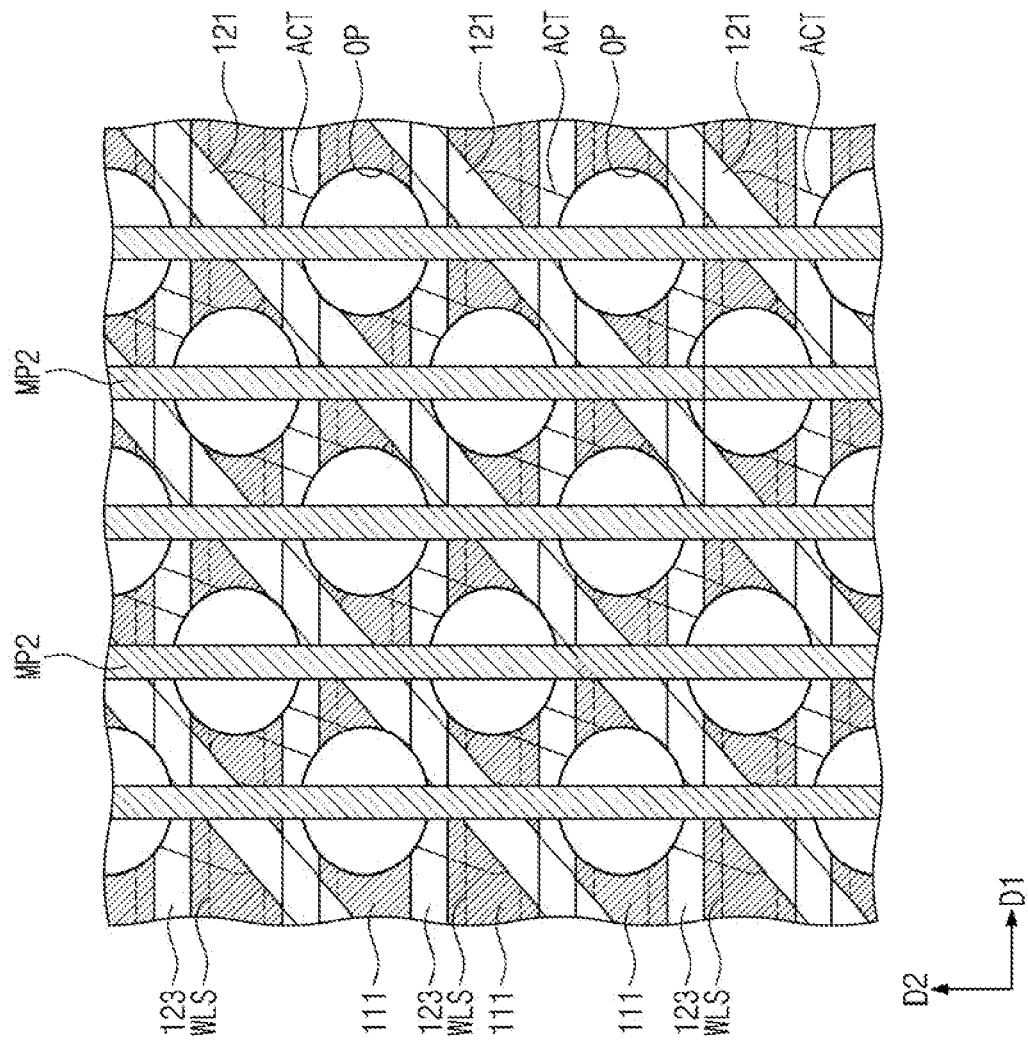
Figure 10A:
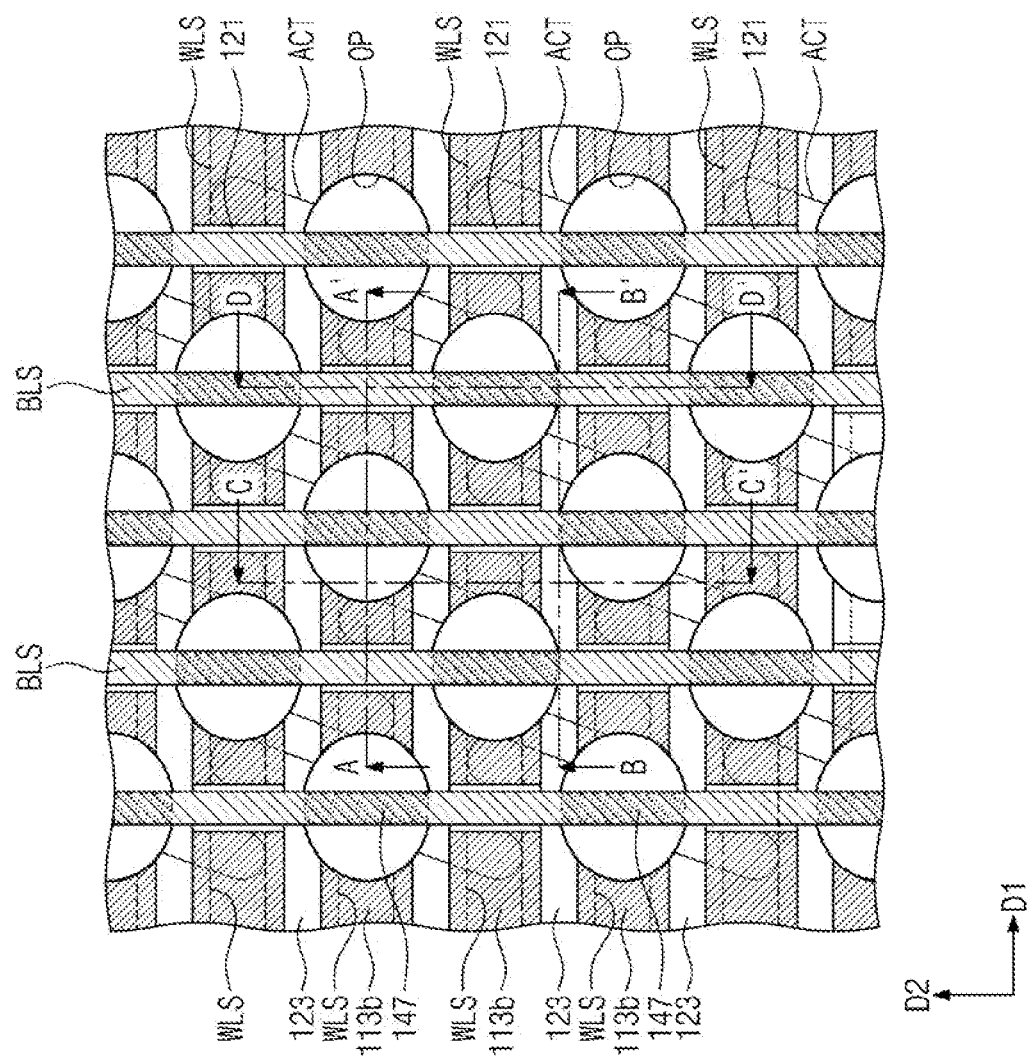
Figure 10B:
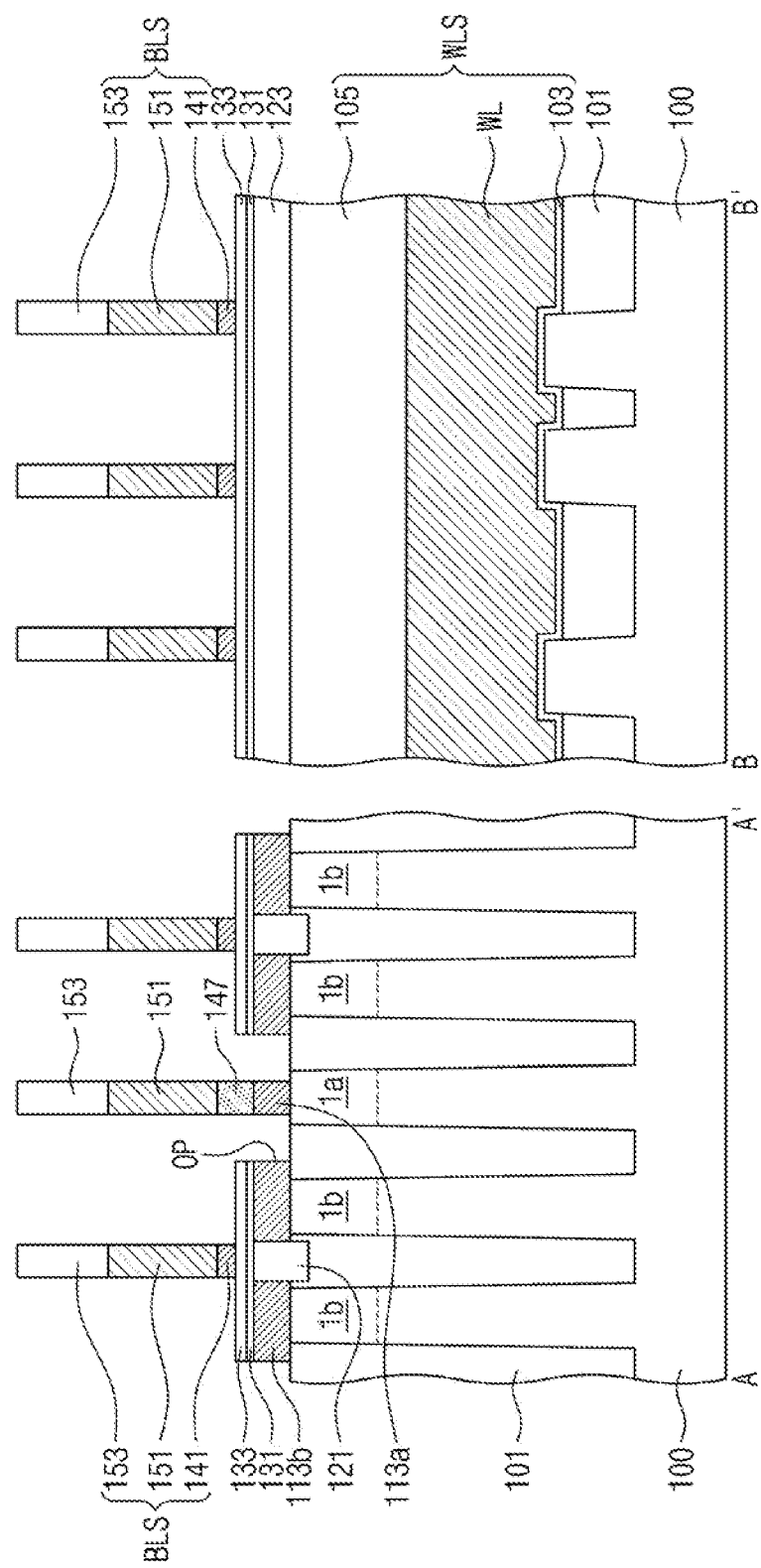
Figure 10C:
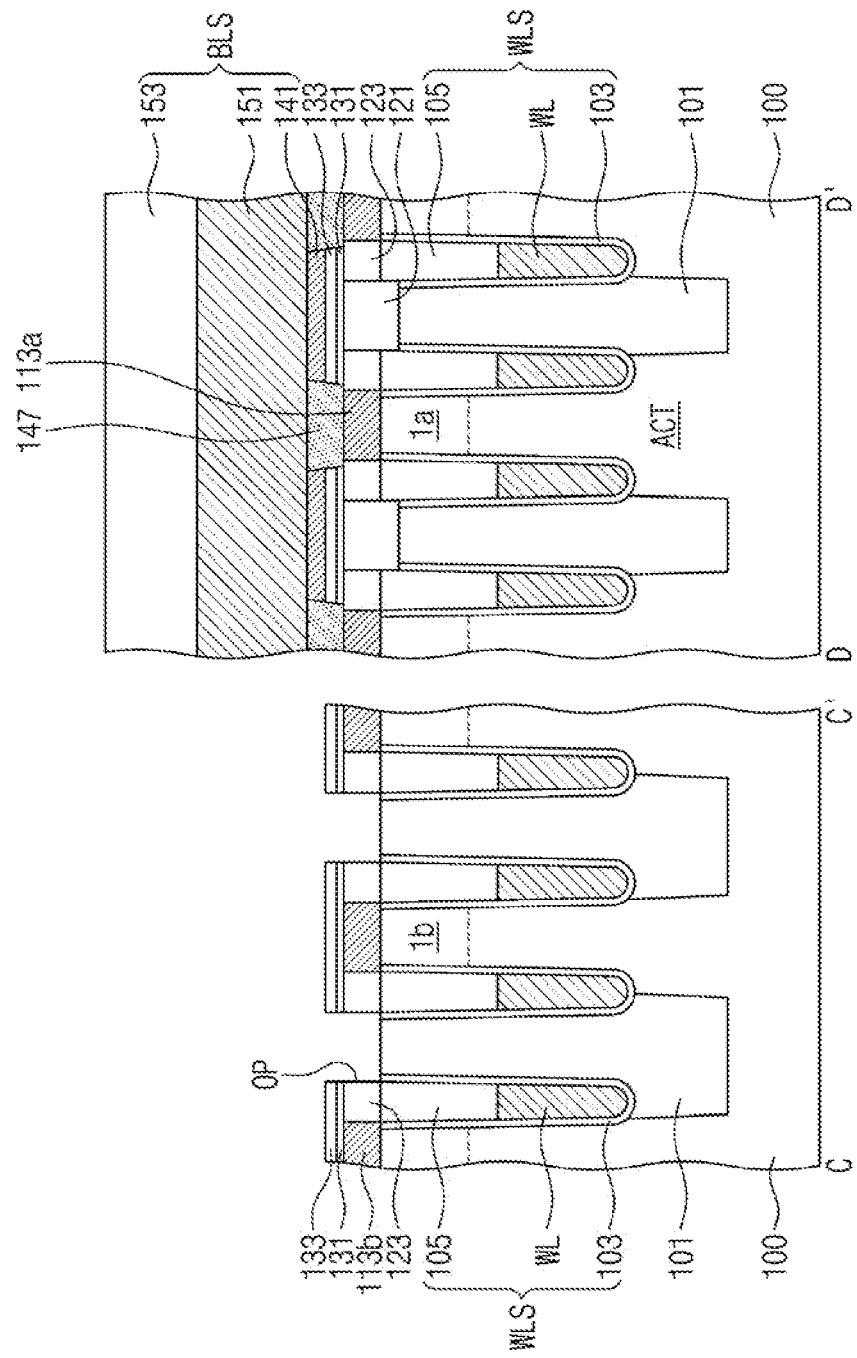
Figure 10D:
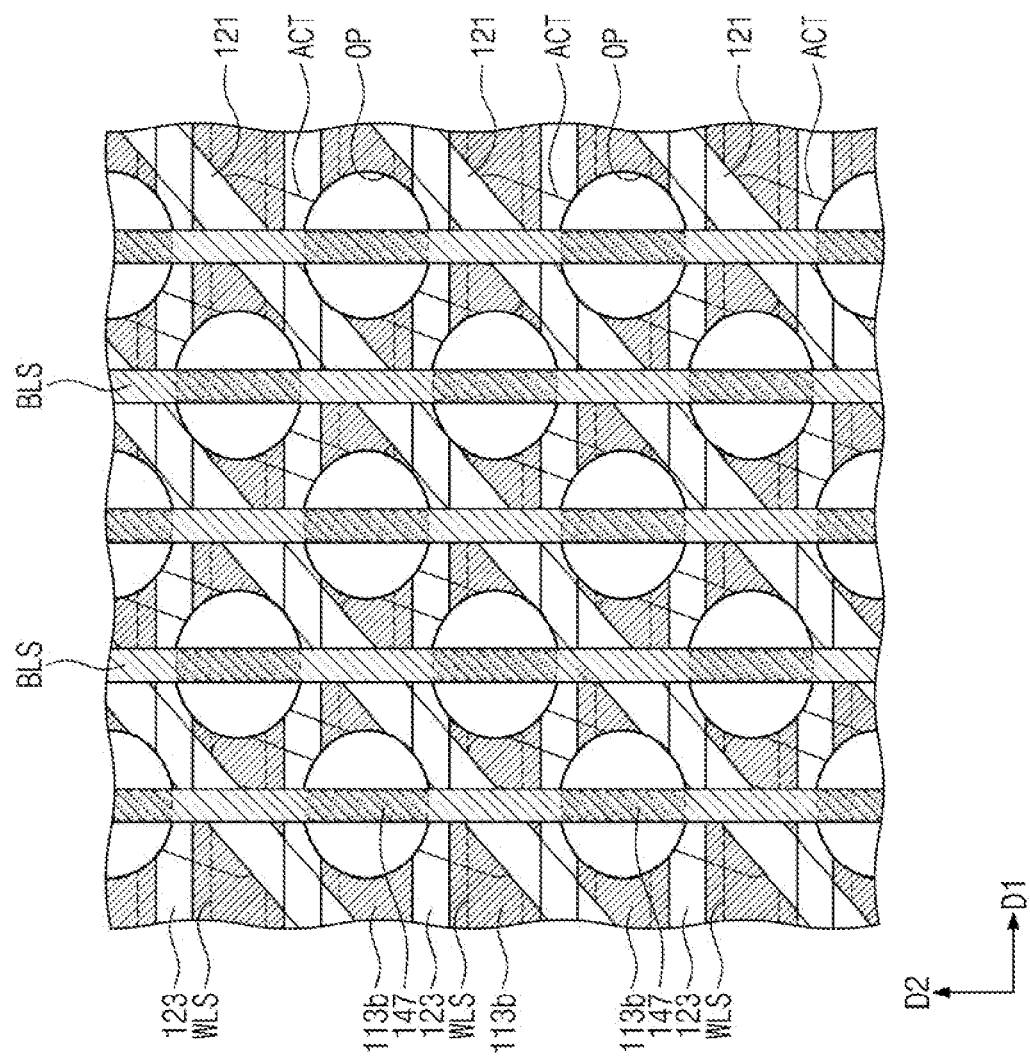
Figure 11A:
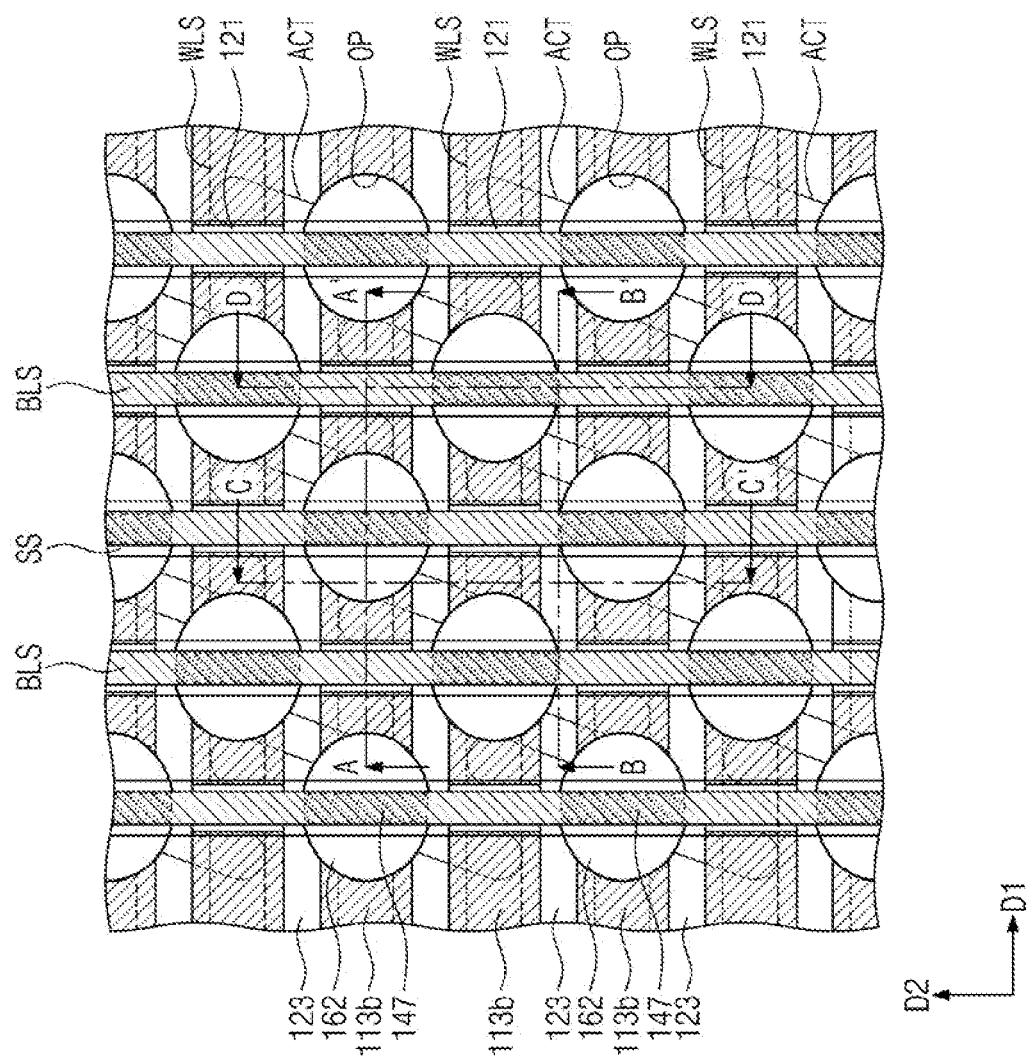
Figure 11B:
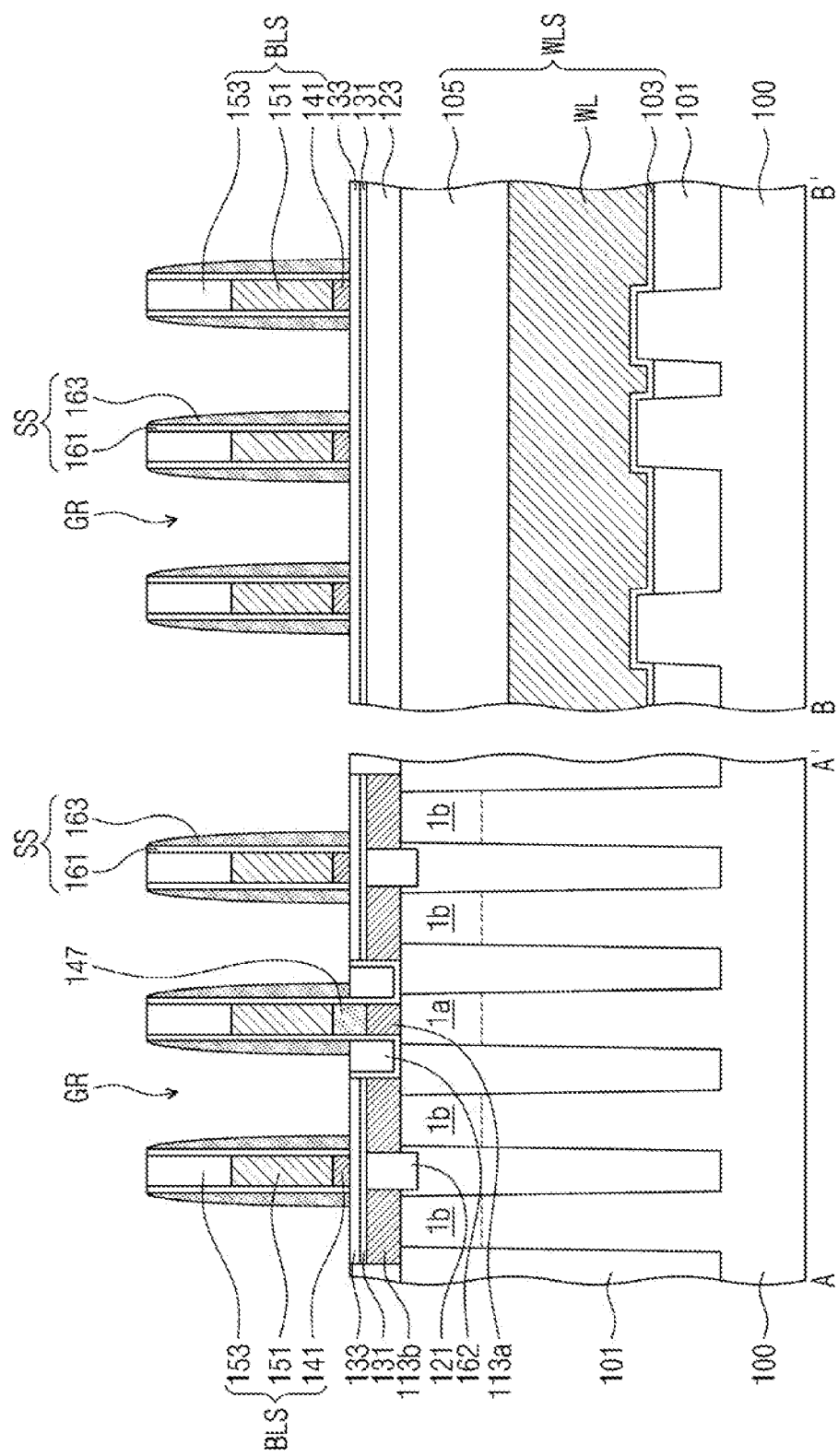
Figure 11C:
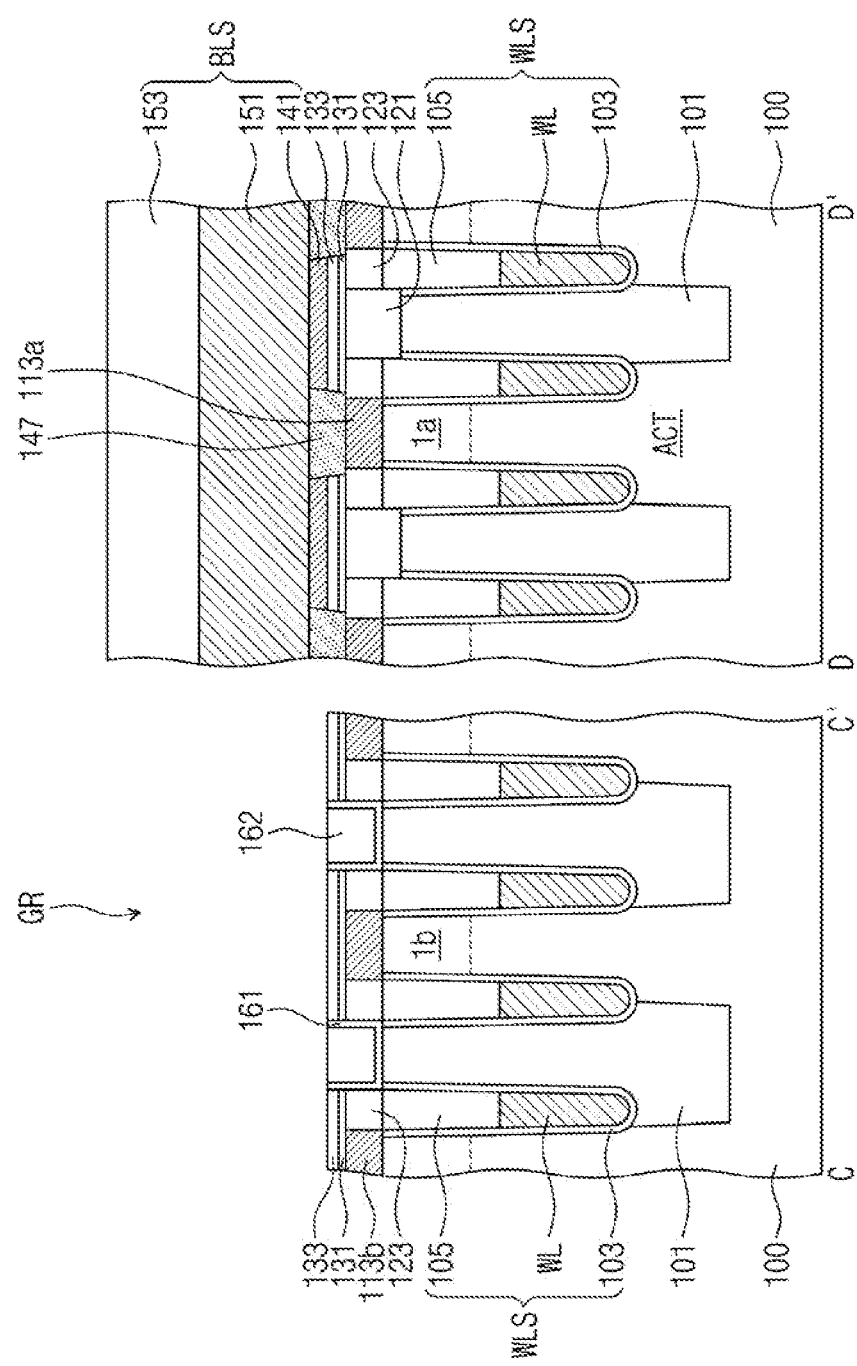
Figure 11D:
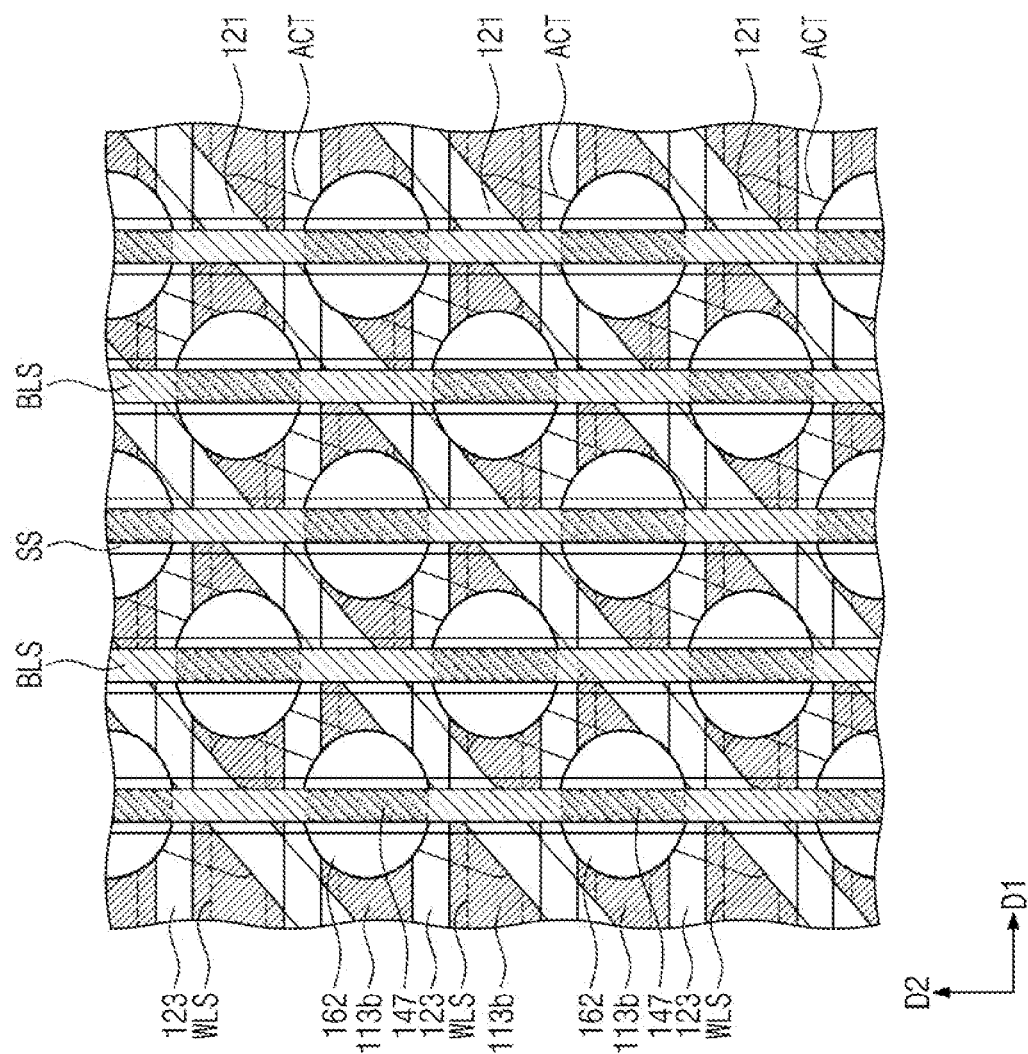

Referring to FIGS. 7A, 7B and 7C, after the formation of the first pad insulating patterns 121, the pad conductive layer 110 may be patterned to form a plurality of pad conductive patterns 111. The pad conductive patterns 111 may be formed to be spaced apart from each other in the first direction D1 and the second direction D2.

The formation of the pad conductive patterns 111 may include forming mask patterns extending in the first direction D1 on the pad conductive layer 110, and anisotropically etching the pad conductive layer 110 using the mask patterns as etch masks to expose the top surfaces of the gate capping patterns 105, thereby forming line openings. Portions of the top surfaces of the gate capping patterns 105 exposed by the line openings may be recessed in the anisotropic etching process of the pad conductive layer 110.

After the formation of the pad conductive patterns 111, an insulating material may be deposited to fill spaces between the pad conductive patterns 111, and a planarization process may be performed on the insulating material to expose top surfaces of the pad conductive patterns 111, thereby forming second pad insulating patterns 123. In an implementation, the second pad insulating patterns 123 may include a silicon nitride layer or a silicon oxynitride layer.

Top surfaces of the second pad insulating patterns 123 may be substantially coplanar with the top surfaces of the pad conductive patterns 111 and the top surfaces of the first pad insulating patterns 121. The second pad insulating patterns 123 may have line shapes extending in the first direction D1. The second pad insulating patterns 123 may be on the gate capping patterns 105 of the word line structures WLS, respectively.

Each of the pad conductive patterns 111 may be between the first pad insulating patterns 121 in the first direction D1 and may be between the second pad insulating patterns 123 in the second direction D2. Each of the pad conductive patterns 111 may have a rectangular shape when viewed in a plan view. In an implementation, referring to FIG. 7D, each of the pad conductive patterns 111 may have a diamond shape or a parallelogram shape when viewed in a plan view.

Referring to FIGS. 8A, 8B, 8C and 8D, first and second buffer insulating layers 131 and 133 and a first conductive layer 135 may be sequentially formed on an entire top surface of the semiconductor substrate 100.

The first buffer insulating layer 131 may cover the top surfaces of the pad conductive patterns 111 and the top surfaces of the first and second pad insulating patterns 121 and 123. The second buffer insulating layer 133 may be thicker (e.g., in the vertical direction) than the first buffer insulating layer 131. In an implementation, each of the first and second buffer insulating layers 131 and 133 may include a silicon oxide layer, a silicon nitride layer, or a silicon oxynitride layer. In an implementation, the first buffer insulating layer 131 may be a silicon oxide layer, and the second buffer insulating layer 133 may be a silicon nitride layer. In an implementation, one of the first buffer insulating layer 131 and the second buffer insulating layer 133 may be omitted.

The first conductive layer 135 may be formed of a semiconductor layer doped with dopants (e.g., a doped poly-silicon layer). In an implementation, the first conductive layer 135 may be omitted.

A first mask pattern MP1 may be formed on the first conductive layer 135. The first mask pattern MP1 may have openings corresponding to the first dopant regions 1a. Each of the openings may have a width greater than a width of the active portion ACT.

Subsequently, the first conductive layer 135 and the first and second buffer insulating layers 131 and 133 may be anisotropically etched using the first mask pattern MP1 as an etch mask to form openings OP exposing the pad conductive patterns 111. The openings OP may be formed by sequentially etching the first conductive layer 135 and the first and second buffer insulating layers 131 and 133, and the flat top surfaces of the pad conductive patterns 111 may be exposed by the openings OP. In an implementation, each of the openings OP may have a circular or elliptical shape. In an implementation, the openings OP may be arranged in a zigzag form or a honeycomb form when viewed in a plan view.

The openings OP may correspond to the first dopant regions 1a, respectively. Portions of the top surfaces of the pad conductive patterns 111 may be recessed when the openings OP are formed. In an implementation, each of the openings OP may be formed to correspond to a pair of the second dopant regions 1b adjacent to each other, as illustrated in FIG. 4B.

After the formation of the openings OP, the first mask pattern MP1 may be removed.

Referring to FIGS. 9A, 9B, 9C and 9D, a second conductive layer 145 filling the openings OP may be formed. A conductive material may be deposited to fill the openings OP, and then, a planarization process may be performed on the conductive material to expose a top surface of the first conductive layer 135, thereby forming the second conductive layer 145. The second conductive layer 145 may be formed of a semiconductor layer doped with dopants (e.g., a doped poly-silicon layer).

A third conductive layer 150 and a hard mask layer 152 may be sequentially formed on the first and second conductive layers 135 and 145.

Second mask patterns MP2 may be formed on the hard mask layer 152. The second mask patterns MP2 may have line shapes extending in the second direction D2. The second mask patterns MP2 may intersect the word line structures WLS and the pad conductive patterns 111.

Referring to FIGS. 10A, 10B, 10C and 10D, the hard mask layer 152, the third conductive layer 150, the first and second conductive layers 135 and 145 and the pad conductive patterns 111 may be sequentially etched using the second mask patterns MP2 as etch masks. Thus, bit line structures BLS and bit line contact patterns 147 may be formed, and the pad conductive patterns 111 may be divided to form first and second conductive pads 113a and 113b. The bit line structures BLS may be formed as described above, and each of the bit line structures BLS may include a poly-silicon pattern 141, a metal pattern 151 and a hard mask pattern 153, which are sequentially stacked. In an implementation, sidewalls of the bit line contact pattern 147 may be spaced apart from a sidewall of the opening OP, and sidewalls of the first conductive pad 113a may be self-aligned with the sidewalls of the bit line contact pattern 147, respectively.

The top surface of the semiconductor substrate 100 and the top surface of the device isolation layer 101 may be exposed in the etching process for forming the bit line structures BLS. In an implementation, distances between the first conductive pad 113a and the second conductive pads 113b may be asymmetrical in the etching process for forming the bit line structures BLS, and in this case, the flat top surface of the semiconductor substrate 100 or the flat top surface of the device isolation layer 101 may also be exposed.

In an implementation, in the etching process for forming the bit line structures BLS, etched depths at both sides of the bit line structure BLS may be substantially equal to each other. In an implementation, when the bit line structures BLS are misaligned as illustrated in FIG. 4A, the etched depths at both sides of the bit line structure BLS may be different from each other. In this case, the same material (i.e., the pad conductive pattern 111 formed of poly-silicon) may exist at both sides of the bit line structure BLS, and a difference between the etched depths at both sides of the bit line structure BLS may be reduced. Thus, a distance between the first conductive pad 113a and a buried contact pattern BC formed in a subsequent process may be sufficiently secured. In an implementation, the top surface of the semiconductor substrate 100 and the top surface of the device isolation layer 101 may be located at different levels, due to an etch selectivity between the semiconductor substrate 100 and the device isolation layer 101 in the formation of the first and second conductive pads 113a and 113b.

Referring to FIGS. 11A, 11B, 11C and 11D, bit line spacers SS may be formed on sidewalls of the bit line structures BLS.

The bit line spacers SS may extend in the second direction D2 along the sidewalls of the bit line structures BLS. In an implementation, portions of the bit line spacers SS may fill the openings OP.

In an implementation, each of the bit line spacers SS may include first and second spacers 161 and 163. The second spacer 163 may include an insulating material having an etch selectivity with respect to the first spacer 161. In an implementation, the first spacer 161 may be a silicon oxide layer, and the second spacer 163 may be a silicon nitride layer. In an implementation, each of the bit line spacers SS may further include a third spacer on the second spacer 163.

In an implementation, the formation of the bit line spacers SS may include sequentially depositing first and second spacer layers conformally covering the bit line structures BLS, and anisotropically etching the first and second spacer layers to form the first and second spacers 161 and 163. In an implementation, when the second spacer layer is anisotropically etched, the second buffer insulating layer 133 may be used as an etch stop layer.

Before the formation of the second spacer 163, bit line contact spacers 162 may be formed to fill the openings in which the first spacer layer is formed. The bit line contact spacers 162 may be formed of an insulating material having an etch selectivity with respect to the second spacer 163.

After the formation of the bit line spacers SS, a gap region GR having a line shape extending in the second direction D2 may be formed between the bit line structures BLS. The gap region GR may expose the top surface of the second buffer insulating layer 133.

Figure 12A:
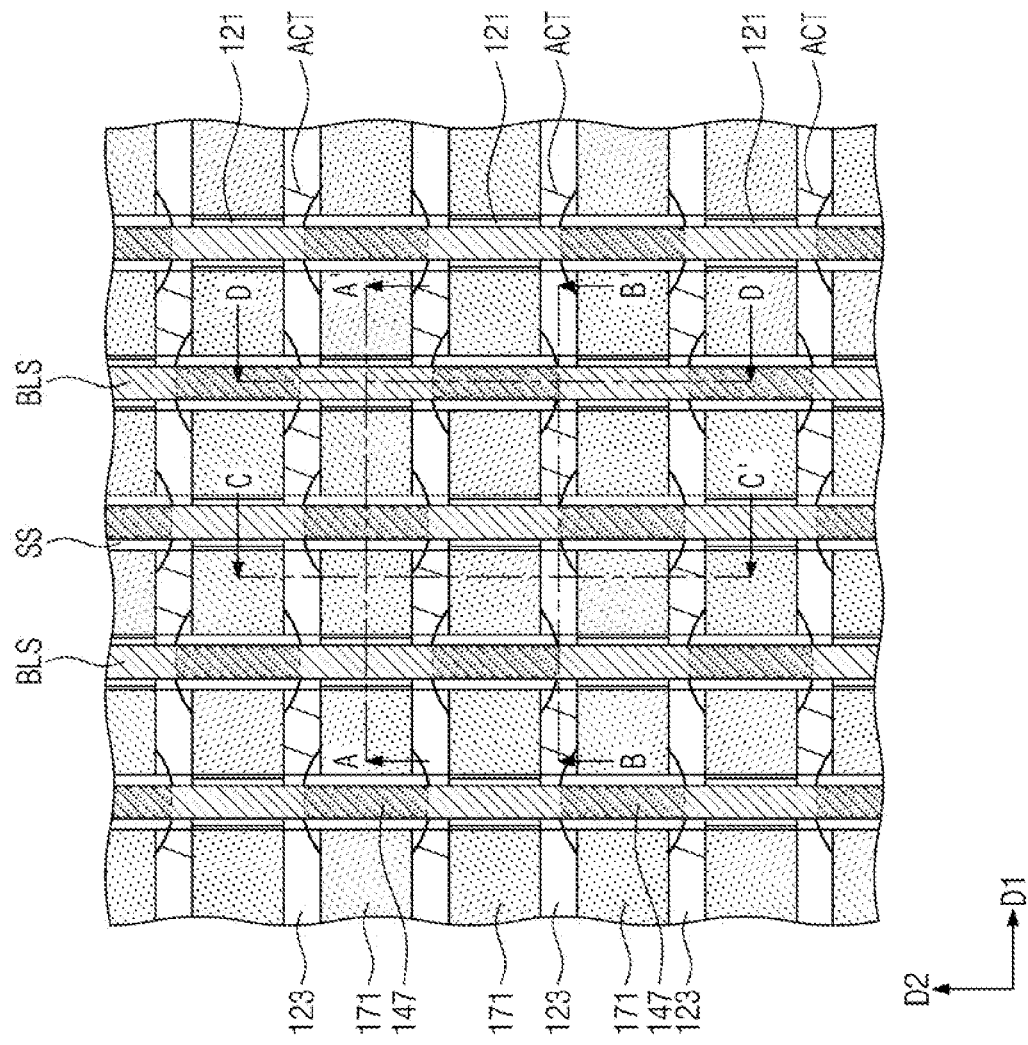
Figure 12B:
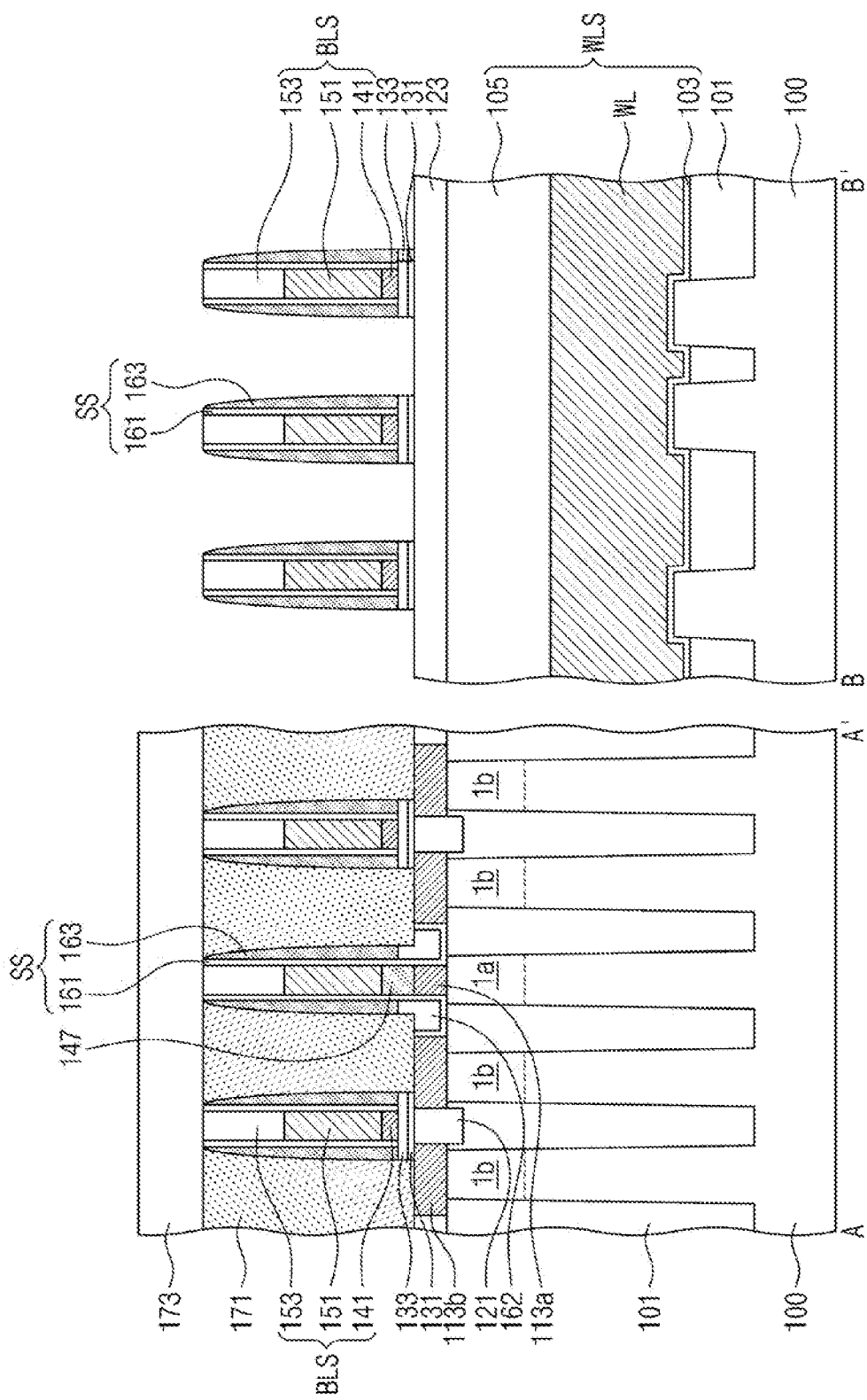
Figure 12C:
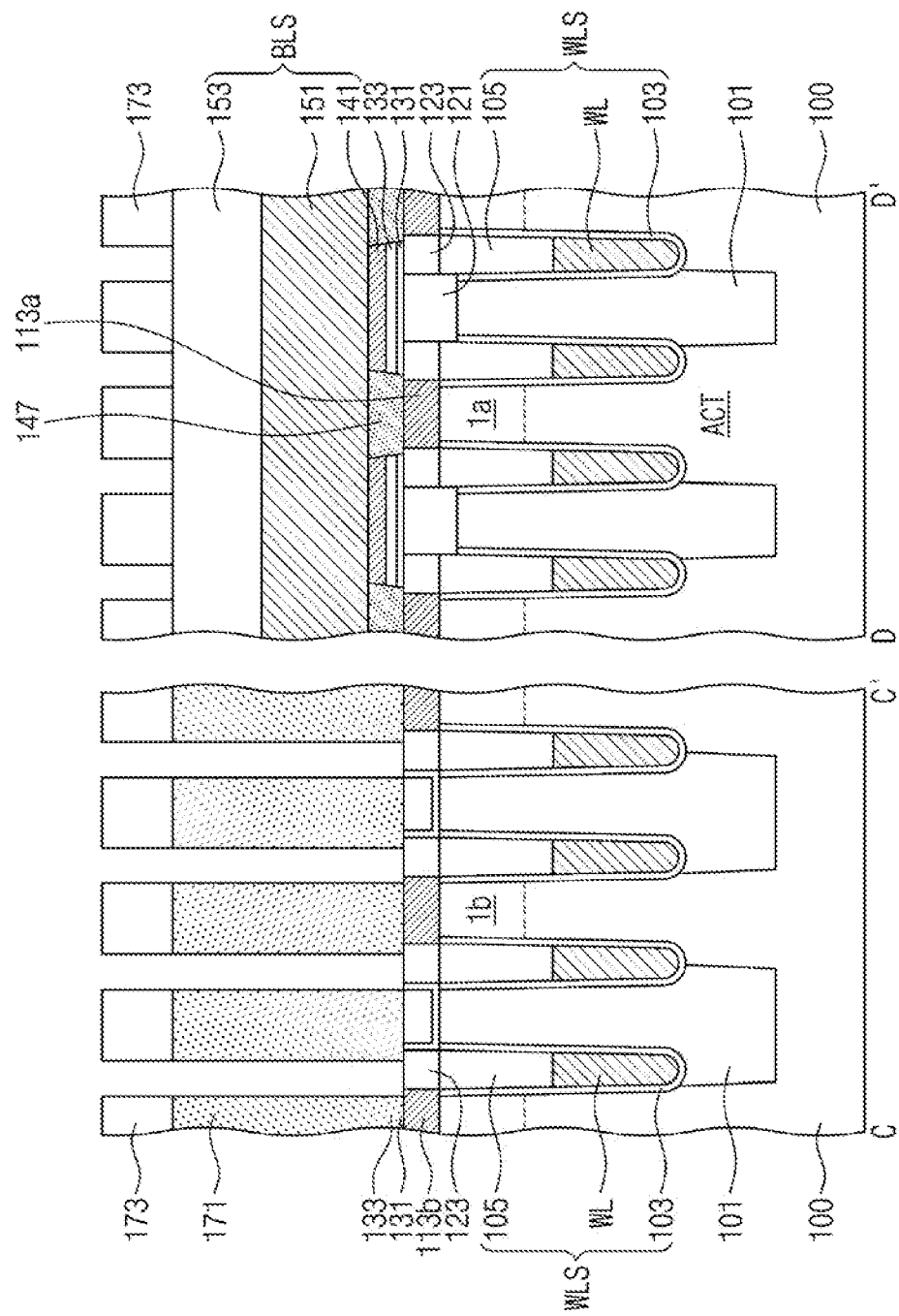

Referring to FIGS. 12A, 12B and 12C, an anisotropic etching process may be performed on the first and second buffer insulating layers 131 and 133 by using the bit line spacers SS and the bit line structures BLS as etch masks.

The first and second buffer insulating layers 131 and 133 may be anisotropically etched to form the gap region GR having a line shape extending in the second direction D2 between the bit line structures BLS. Top surfaces of the second conductive pads 113b may be exposed through the gap region GR of the line shape.

A contact conductive layer may be formed in the gap regions GR of the line shapes. The contact conductive layer may be in direct contact with the top surfaces of the second conductive pads 113b. In an implementation, the contact conductive layer may include a semiconductor material doped with dopants (e.g., doped silicon), a metal (e.g., tungsten, aluminum, titanium, or tantalum), a conductive metal nitride (e.g., titanium nitride, tantalum nitride, or tungsten nitride), or a metal-semiconductor compound (e.g., a metal silicide).

In an implementation, the formation of the contact conductive layer may include depositing a poly-silicon layer doped with dopants, and performing a planarization process on the poly-silicon layer to expose top surfaces of the bit line structures BLS. The contact conductive layer may fill the gap region of the line shape.

Third mask patterns 173 extending in the first direction D1 may be formed on the bit line structures BLS and the contact conductive layer. Each of the third mask patterns 173 may be between the word line structures WLS when viewed in a plan view.

The contact conductive layer may be anisotropically etched using the third mask patterns 173 as etch masks to form contact patterns 171 exposing the gate capping patterns 105. The contact patterns 171 may be spaced apart from each other in the second direction D2 between the bit line structures BLS. Portions of the bit line structures BLS and portions of the bit line spacers SS may be etched in the anisotropic etching process performed on the contact conductive layer.

Figure 13A:
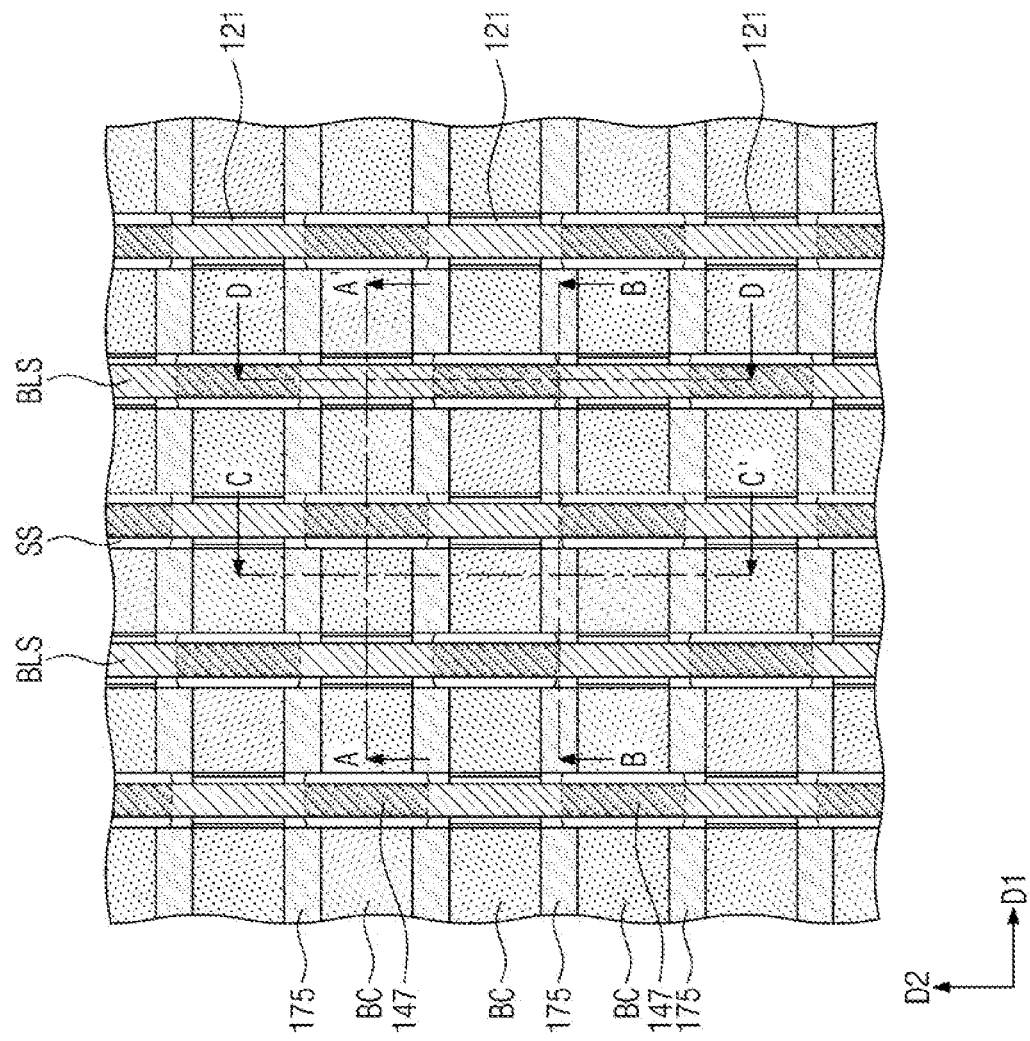
Figure 13B:
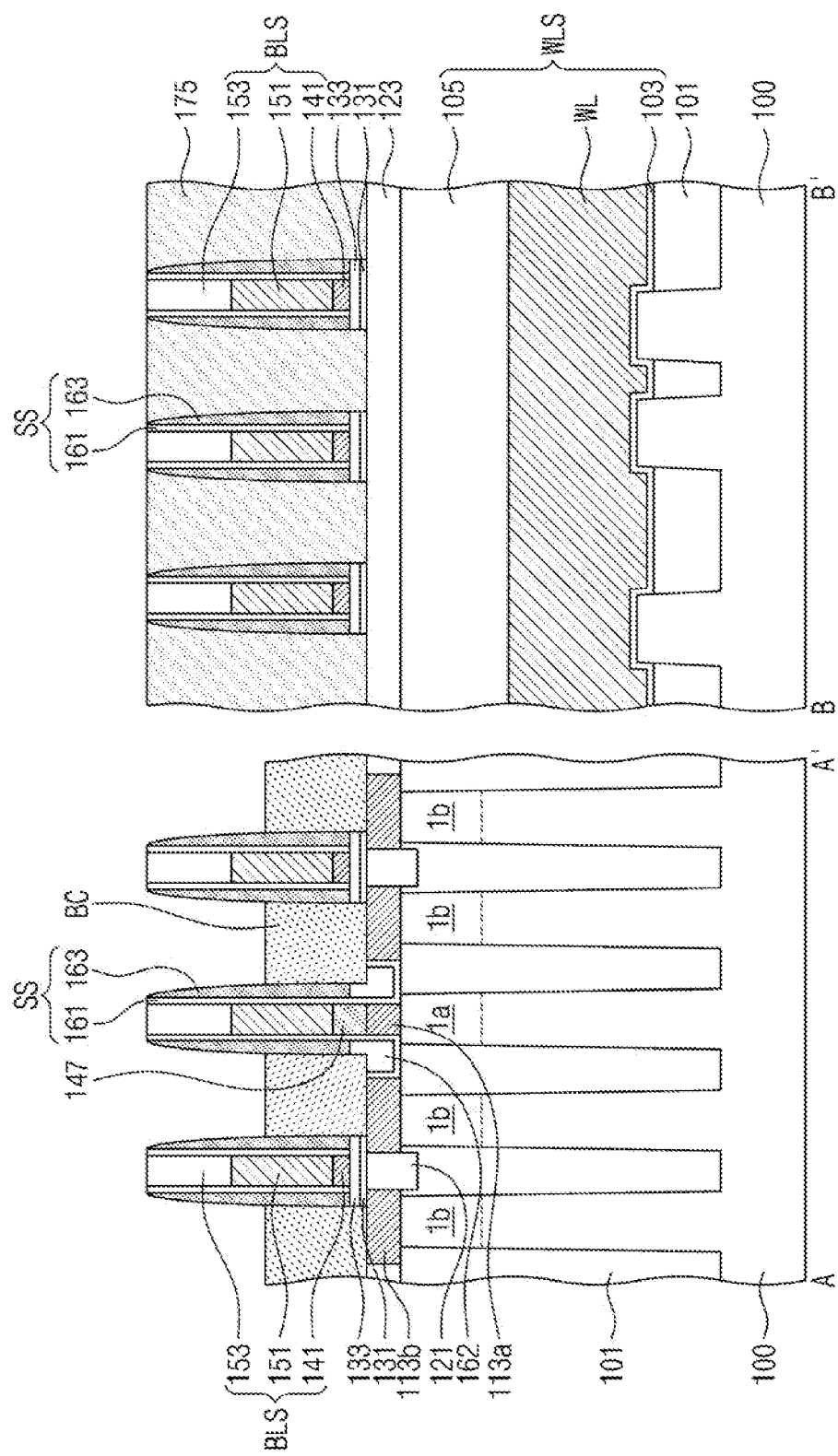
Figure 13C:
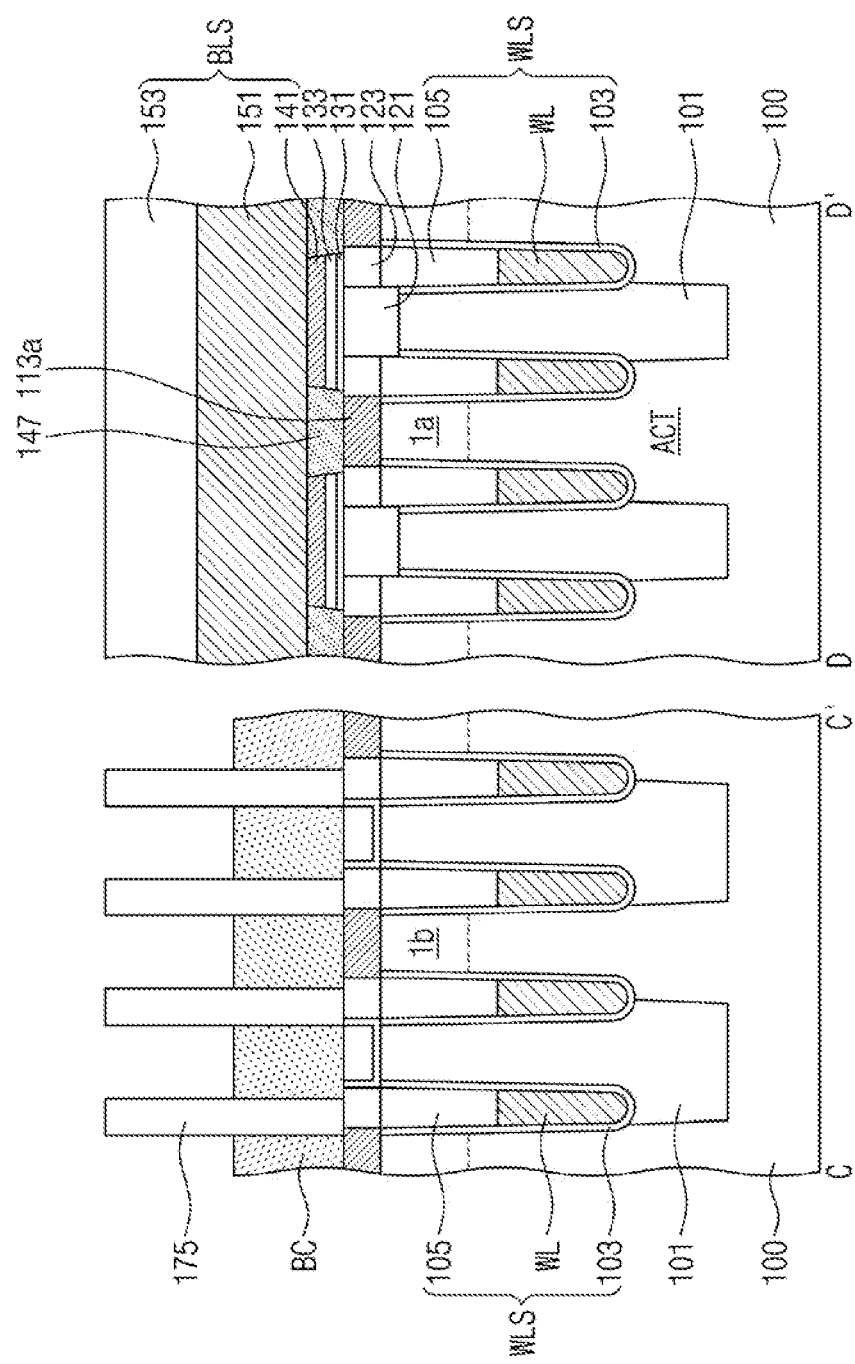

Referring to FIGS. 13A, 13B and 13C, each of fence patterns 175 may be formed between the contact patterns 171 adjacent to each other in the second direction D2. The fence patterns 175 may overlap with the word lines WL when viewed in a plan view. The fence patterns 175 may be formed of an insulating material having an etch selectivity with respect to the contact patterns 171, e.g., silicon oxide, silicon nitride, or silicon oxynitride.

After the formation of the fence patterns 175, top surfaces of the contact patterns 171 may be recessed to form buried contact patterns BC filling lower portions of contact regions. In an implementation, top surfaces of the buried contact patterns BC may be below top surfaces of the hard mask patterns 153 of the bit line structures BLS. The buried contact patterns BC formed as described above may be in contact with the top surfaces of the second conductive pads 113b, respectively.

Figure 14A:
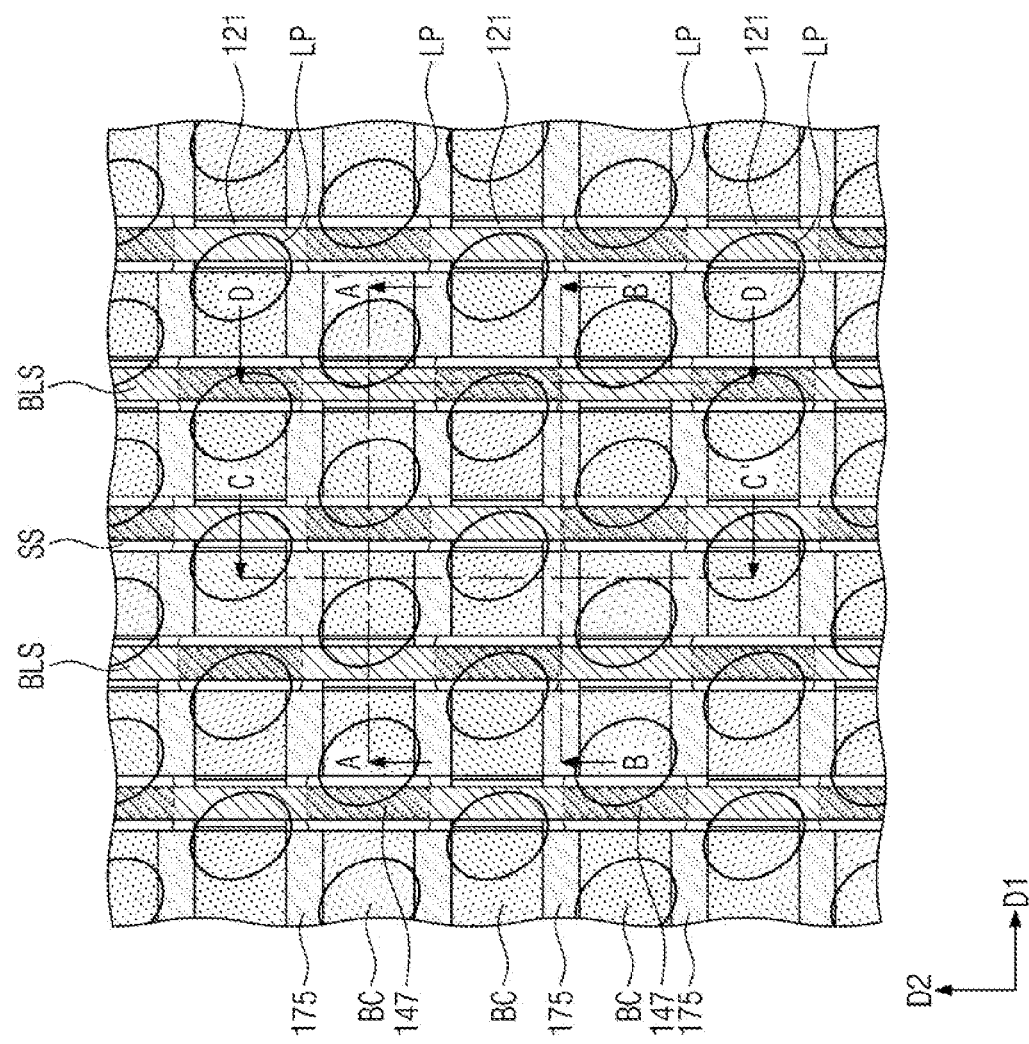
Figure 14B:
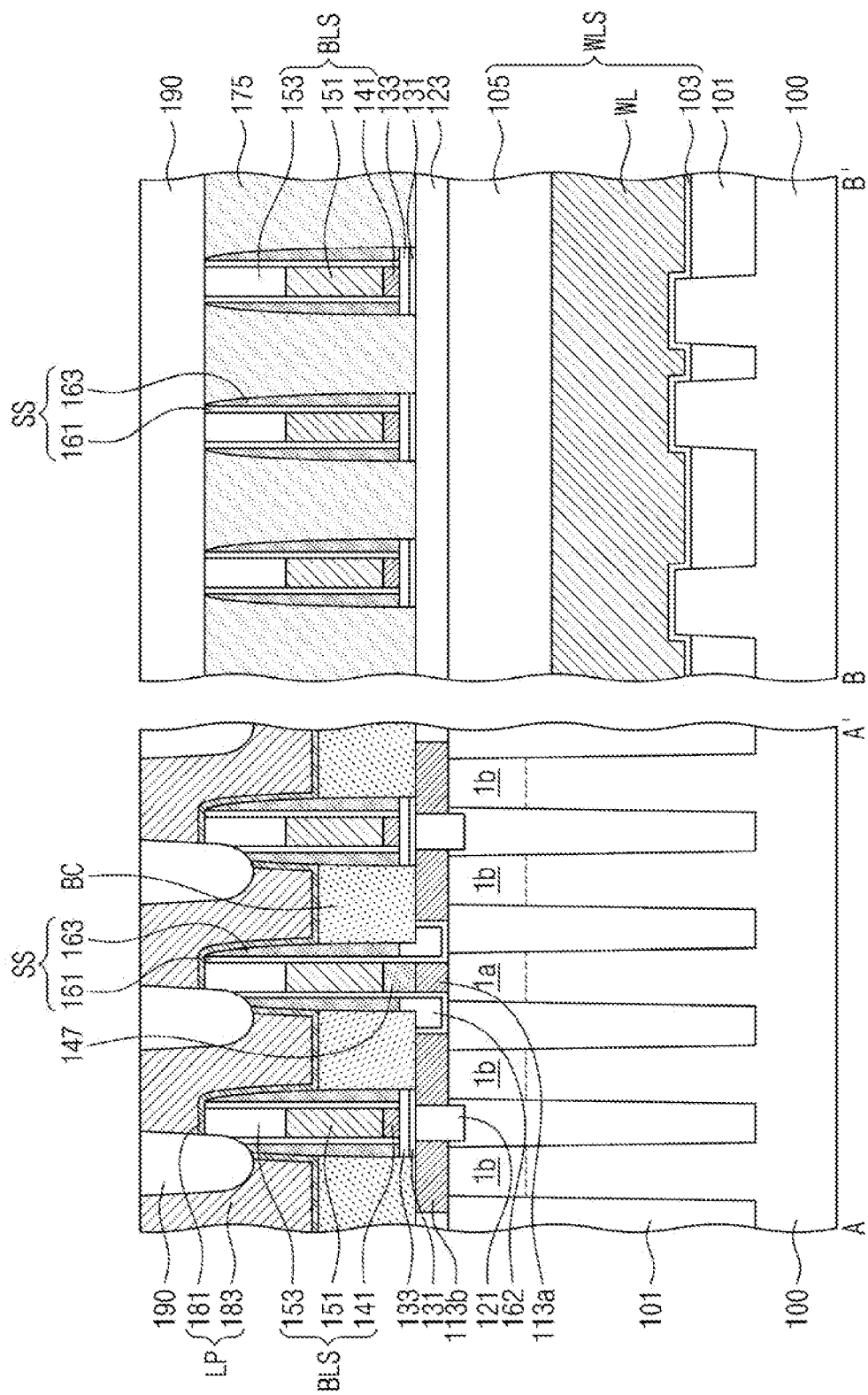
Figure 14C:
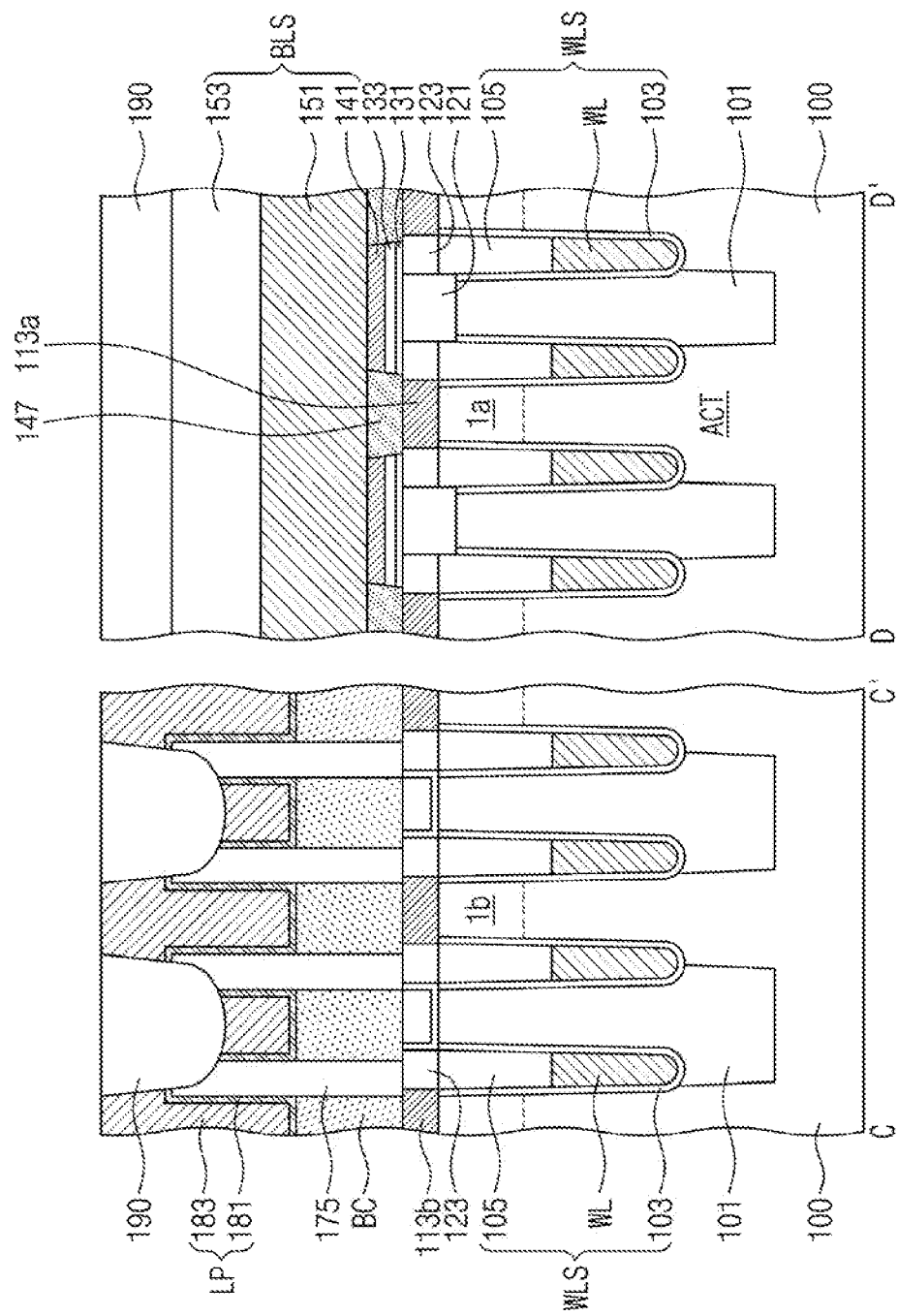

Referring to FIGS. 14A, 14B and 14C, landing pads LP may be formed to be connected to the buried contact patterns BC, respectively.

The formation of the landing pads LP may include conformally depositing a barrier metal layer on an entire top surface of the semiconductor substrate 100, forming a metal layer filling the contact regions on the barrier metal layer, forming mask patterns on the metal layer, and sequentially etching the metal layer and the barrier metal layer using the mask patterns as etch masks to form a pad recess region. In the formation of the landing pads LP, contact silicide patterns may be formed between the top surfaces of the buried contact patterns BC and the landing pads LP, respectively.

In the formation of the pad recess region, the pad recess region may have a bottom surface below the top surfaces of the bit line structures BLS to separate the landing pads LP from each other. In an implementation, a portion of the hard mask pattern 153 and a portion of the bit line spacer SS may be etched in the formation of the pad recess region.

Each of the landing pads LP may include a lower portion filling the contact region between the bit line structures BLS, and an upper portion extending onto a top end of the bit line structure BLS. The upper portion of each of the landing pads LP may have an elliptical shape when viewed in a plan view, and the landing pad LP having the elliptical shape may be formed to have a longitudinal axis (or long axis) in an oblique direction with respect to the first and second directions D1 and D2.

Thereafter, the pad recess region may be filled with a recess insulating pattern 190 formed of an insulating material.

According to the embodiments, the bit line contact pattern and the bit line may be formed after forming the conductive pad on the top surface of the semiconductor substrate, and thus it is possible to help prevent the bottom surface of the bit line contact pattern from being rounded or from having an inclined surface. As a result, reliability of the semiconductor memory device may be improved.

In addition, even if the bit line were to be misaligned, the difference between the etched depths at both sides of the bit line may be reduced, and thus the distance between the bit line contact pattern and the buried contact pattern may be sufficiently secured. As a result, the reliability of the semiconductor memory device may be more improved.

One or more embodiments may provide a semiconductor memory device with improved electrical characteristics and reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor memory device, comprising:
    a semiconductor substrate;
    a device isolation layer defining an active portion in the semiconductor substrate;
    a bit line structure intersecting the active portion on the semiconductor substrate;
    a first conductive pad between the bit line structure and the active portion;
    a bit line contact pattern between the first conductive pad and the bit line structure;
    a first bit line contact spacer covering a first sidewall of the first conductive pad; and
    a second bit line contact spacer covering a second sidewall of the first conductive pad,
    wherein:
    the first conductive pad has a flat bottom surface that is in contact with a top surface of the active portion, and
    a width of the first bit line contact spacer is different from a width of the second bit line contact spacer.

2. The semiconductor memory device as claimed in claim 1, wherein the bottom surface of the first conductive pad is at substantially the same level as a top surface of the device isolation layer and a top surface of the semiconductor substrate.

3. The semiconductor memory device as claimed in claim 1, further comprising word line structures that extend in a first direction, intersect the active portion, and are buried in the semiconductor substrate,
    wherein:
    each of the word line structures includes a word line, a gate capping pattern on the word line, and a gate insulating pattern between the semiconductor substrate and the word line, and
    the bottom surface of the first conductive pad is at substantially the same level as a top surface of the gate capping pattern.

4. The semiconductor memory device as claimed in claim 1, wherein a bottom surface of the first bit line contact spacer and a bottom surface of the second bit line contact spacer are at substantially the same level.

5. The semiconductor memory device as claimed in claim 1, wherein the bottom surface of the first conductive pad is in contact with a portion of a top surface of the device isolation layer.

6. The semiconductor memory device as claimed in claim 1, wherein the first bit line contact spacer and the second bit line contact spacer each has a bottom surface at a lower level than the bottom surface of the first conductive pad.

7. The semiconductor memory device as claimed in claim 6, wherein the bottom surface of the first bit line contact spacer and the bottom surface of the second bit line contact spacer are at different levels.

8. A semiconductor memory device, comprising:
    a semiconductor substrate;
    a device isolation layer defining active portions in the semiconductor substrate;
    first pad insulating patterns on the semiconductor substrate and between the active portions, in a plan view;
    a first conductive pad on the semiconductor substrate and between the first pad insulating patterns adjacent to each other in a first direction;
    second conductive pads on the semiconductor substrate and between the first conductive pad and the first pad insulating patterns;
    a bit line structure on the first conductive pad, extending in a second direction, and intersecting the active portions;
    a bit line contact pattern between the bit line structure and the first conductive pad; and
    buried contact patterns on the second conductive pads,
    wherein:
    the first conductive pad and the second conductive pad each have a flat bottom surface that are at substantially the same level, and
    the first conductive pad has a sidewall aligned with a sidewall of the bit line contact pattern.

9. The semiconductor memory device as claimed in claim 8, wherein:
    a first sidewall of the first conductive pad is spaced apart from one of the second conductive pads by a first distance,
    a second sidewall of the first conductive pad is spaced apart from another of the second conductive pads by a second distance, and
    the second distance is different from the first distance.

10. The semiconductor memory device as claimed in claim 8, further comprising a word line structure that extends in the first direction, intersects the active portion, and is buried in the semiconductor substrate,
    wherein:
    the word line structure includes a word line, a gate capping pattern on the word line, and a gate insulating pattern between the semiconductor substrate and the word line, and
    the bottom surface of the first conductive pad and the bottom surface of the second conductive pad are at substantially the same level as a top surface of the gate capping pattern.

11. The semiconductor memory device as claimed in claim 10, wherein the second conductive pads are between the active portions and the buried contact patterns at a side of the word line structure.

12. The semiconductor memory device as claimed in claim 8, wherein sidewalls of the second conductive pads are in contact with the first pad insulating patterns.

13. The semiconductor memory device as claimed in claim 8, wherein a thickness of the first conductive pad is less than thicknesses of the second conductive pads.

14. The semiconductor memory device as claimed in claim 8, further comprising bit line spacers covering sidewalls of the bit line structure,
wherein portions of the bit line spacers are between the first conductive pad and the second conductive pads.

15. The semiconductor memory device as claimed in claim 8, further comprising a bit line contact spacer covering the sidewall of the first conductive pad,
wherein a bottom surface of the bit line contact spacer is at a lower level than the bottom surface of the first conductive pad.

16. The semiconductor memory device as claimed in claim 8, further comprising second pad insulating patterns extending in the first direction on the semiconductor substrate,
wherein the first conductive pad is between the second pad insulating patterns adjacent to each other in the second direction.

17. A semiconductor memory device, comprising:
a semiconductor substrate;
a device isolation layer defining active portions in the semiconductor substrate;
word line structures buried in the semiconductor substrate, extending in a first direction, and intersecting the active portions, each of the word line structures including a word line; a gate capping pattern on the word line; and a gate insulating pattern between the semiconductor substrate and the word line;
first pad insulating patterns, each of which is on the semiconductor substrate and is between end portions of the active portions adjacent to each other in the first direction in a plan view;
second pad insulating patterns extending in the first direction on the word line structures;
a bit line structure intersecting the word line structures and extending in a second direction intersecting the first direction;
a first conductive pad between the bit line structure and the active portion;
a bit line contact pattern between the bit line structure and the first conductive pad;
second conductive pads on the semiconductor substrate and on end portions of the active portions;
bit line spacers on sidewalls of the bit line structure; and
buried contact patterns on the second conductive pads,
wherein:
the first conductive pad and the second conductive pad each have a flat bottom surface,
the bottom surface of the first conductive pad and the bottom surface of the second conductive pad are each at substantially the same level as a top surface of the gate capping pattern, and
the first conductive pad has a sidewall aligned with a sidewall of the bit line contact pattern and at least one of the sidewalls of the bit line structure.

18. The semiconductor memory device as claimed in claim 17, further comprising a bit line contact spacer covering the sidewall of the first conductive pad,
wherein a bottom surface of the bit line contact spacer is at a lower level than the bottom surface of the first conductive pad.

19. The semiconductor memory device as claimed in claim 17, wherein:
a bottom surface of the first pad insulating pattern is at a lower level than a bottom surface of the second pad insulating pattern, and
the second pad insulating pattern is on the top surface of the gate capping pattern.

20. The semiconductor memory device as claimed in claim 17, wherein a top surface of the first insulating pattern, a top surface of the second pad insulating pattern, a top surface of the first conductive pad, and a top surface of the second conductive pad are at substantially the same level.

\* \* \* \* \*